US012632083B2

(12) United States Patent
Hwang et al.

(10) Patent No.: US 12,632,083 B2
(45) Date of Patent: May 19, 2026

(54) DISPLAY DEVICE AND METHOD OF MANUFACTURING THE SAME

(71) Applicant: Samsung Display Co., Ltd., Yongin-si (KR)

(72) Inventors: Seongjin Hwang, Yongin-si (KR);
Byunghoon Kang, Yongin-si (KR);
Sanghoon Kim, Yongin-si (KR);
Sunghoon Kim, Yongin-si (KR);
Seungho Kim, Yongin-si (KR); **Jingyu
Sim, Yongin-si (KR); Hyunji Lee**,
Yongin-si (KR); Min-Hoon Choi,
Yongin-si (KR)

(73) Assignee: SAMSUNG DISPLAY CO., LTD.,
Yongin-si (KR)

( * ) Notice: Subject to any disclaimer, the term of this patent is extended or adjusted under 35 U.S.C. 154(b) by 210 days.

(21) Appl. No.: 18/522,223

(22) Filed: Nov. 29, 2023

(65) Prior Publication Data

US 2024/0184328 A1      Jun. 6, 2024

(30) Foreign Application Priority Data

Dec. 1, 2022     (KR) ........................ 10-2022-0165993

(51) Int. Cl.
G06F 1/16          (2006.01)
H10K 50/844       (2023.01)
          (Continued)

(52) U.S. Cl.
CPC .......... G06F 1/1616 (2013.01); G06F 1/1652
(2013.01); H10K 50/844 (2023.02);
          (Continued)

(58) Field of Classification Search
CPC combination set(s) only.
See application file for complete search history.

(56) References Cited

U.S. PATENT DOCUMENTS 9,786,207 B2 * 10/2017 Kim ........................ G09F 9/301
9,811,119 B2 * 11/2017 Seo ........................ G06F 1/1679
          (Continued)

FOREIGN PATENT DOCUMENTS

JP          2022-530781          7/2022
KR          10-2385232          4/2022
          (Continued)

OTHER PUBLICATIONS

Nikola Pekas et al., Wet-etching of structures with straight facets and adjustable taper into glass substrates, Lab Chip, 2010, 10, 494-498.

(Continued)

*Primary Examiner* — Lisa Lea-Edmonds
(74) *Attorney, Agent, or Firm* — F. CHAU & ASSOCIATES, LLC

(57)          ABSTRACT

A display device includes a display panel in which a first non-folding area, a folding area, and a second non-folding area may be sequentially defined in a first direction, and a lower plate which is coupled to a lower portion of the display panel, the lower plate including a plurality of patterns overlapping the folding area, wherein a minimum width of the display panel in the first direction is smaller than a minimum width of the lower plate in the first direction.

20 Claims, 20 Drawing Sheets

(51) Int. Cl.

| | |
|---|---|
| *H10K 59/126* | (2023.01) |
| *H10K 59/40* | (2023.01) |
| *H10K 71/20* | (2023.01) |
| *H10K 77/10* | (2023.01) |

(52) U.S. Cl.
CPC .......... *H10K 59/126* (2023.02); *H10K 59/40* (2023.02); *H10K 71/231* (2023.02); *H10K 77/111* (2023.02)

(56) References Cited

U.S. PATENT DOCUMENTS

| | | | |
|---|---|---|---|
| 10,020,462 B1 | 7/2018 | Ai et al. | |
| 10,032,391 B2* | 7/2018 | Kim | G06F 1/1641 |
| 10,297,785 B2* | 5/2019 | Ahn | G06F 1/1681 |
| 10,915,139 B2* | 2/2021 | Park | G06F 1/1641 |
| 11,048,302 B2* | 6/2021 | Seo | H04M 1/0216 |
| 11,470,734 B2* | 10/2022 | Sim | G06F 1/1637 |
| 11,812,566 B2* | 11/2023 | Sim | H04M 1/0268 |
| 11,895,880 B2* | 2/2024 | Jeon | H10D 86/60 |
| 12,019,471 B2* | 6/2024 | Kim | G06F 1/1656 |
| 12,111,692 B2* | 10/2024 | Kishimoto | G06F 1/1656 |
| 12,212,701 B2* | 1/2025 | Kim | H04M 1/0268 |
| 12,232,284 B2* | 2/2025 | Sim | G06F 1/1637 |
| 12,265,425 B2* | 4/2025 | Kim | H04M 1/0214 |
| 12,295,109 B2* | 5/2025 | Kim | H05K 5/0217 |
| 12,342,712 B2* | 6/2025 | Kim | C03B 33/0222 |
| 12,346,153 B2* | 7/2025 | Kim | G06F 1/1616 |
| 12,358,262 B2* | 7/2025 | Kim | H10K 59/122 |
| 2017/0365197 A1* | 12/2017 | Kim | G06F 1/1641 |
| 2019/0069421 A1* | 2/2019 | Lee | H05K 5/03 |
| 2019/0090364 A1* | 3/2019 | Shin | H10K 59/40 |
| 2021/0337686 A1* | 10/2021 | Sim | G06F 1/1652 |
| 2022/0068165 A1* | 3/2022 | Park | G06F 1/1616 |
| 2022/0190264 A1 | 6/2022 | Yun et al. | |
| 2022/0223806 A1 | 7/2022 | Ostholt et al. | |
| 2022/0261034 A1* | 8/2022 | Lee | G06F 1/1652 |
| 2023/0027462 A1* | 1/2023 | Hsu | G06F 1/1652 |
| 2023/0119209 A1* | 4/2023 | Choi | G06F 1/1652 |
| | | | 361/679.01 |
| 2023/0179690 A1* | 6/2023 | Lv | G06F 1/1681 |
| | | | 455/566 |
| 2024/0081007 A1* | 3/2024 | Sim | H04M 1/0268 |
| 2024/0184328 A1* | 6/2024 | Hwang | H10K 77/111 |
| 2024/0345623 A1* | 10/2024 | Kim | G06F 1/1656 |
| 2025/0142746 A1* | 5/2025 | Jung | G06F 1/1643 |
| 2025/0220094 A1* | 7/2025 | Seo | G09F 9/30 |

FOREIGN PATENT DOCUMENTS

| | | |
|---|---|---|
| KR | 10-2022-0065575 | 5/2022 |
| KR | 10-2022-0082964 | 6/2022 |

OTHER PUBLICATIONS

Kim Hyun-joong et al., Physical property analysis and application examples of adhesives (13th), Journal of Adhesion and Interface vol. 8, No. 1, 2007.

Hyeongsik Park et al., A Review of Wet Chemical Etching of Glasses in Hydrofluoric Acid based Solution for Thin Film Silicon Solar Cell Application, Current Photovoltaic Research 5(3) 75-82 (2017).

Lee et al., "Effect of silane coupling agent on thermal stability and adhesion properties of DGEBF epoxy resin", Polymer Korea, Nov. 2014, pp. 787-790, vol. 38, No. 6.

Darling, R. B., 2013, "Wet Etching", EE-527.

* cited by examiner

DISPLAY DEVICE AND METHOD OF MANUFACTURING THE SAME

CROSS-REFERENCE TO RELATED APPLICATIONS

This application claims priority under 35 U.S.C. § 119 from Korean Patent Application No. 10-2022-0165993 filed on Dec. 1, 2022 in the Korean Intellectual Property Office, the entire contents of which are incorporated herein by reference.

BACKGROUND

1. Technical Field

Embodiments of the disclosure described herein relate to a display device with improved product quality and product reliability, and a method of manufacturing a display device with simplified processes.

2. Description of the Related Art

A display device provides information to a user by displaying various images on a display screen. In general, a display device displays information within an assigned screen. Recently, a flexible display device including a foldable flexible display panel has been developed. Unlike a rigid display device, the flexible display device may be folded, rolled, or bent. The flexible display device, which can be changed to various shapes, may be carried regardless of an existing screen size, thereby improving user convenience.

SUMMARY

Embodiments of the disclosure provide a display device with improved product quality and product reliability.

Embodiments of the disclosure provide a method of manufacturing a display device with simplified processes.

According to an embodiment, a display device may include a display panel in which a first non-folding area, a folding area, and a second non-folding area may be sequentially defined in a first direction, and a lower plate which may be coupled to a lower portion of the display panel and in which multiple patterns overlapping the folding area may be defined, wherein a minimum width of the display panel in the first direction may be smaller than a minimum width of the lower plate in the first direction.

An upper surface of the lower plate may contact (e.g., directly contact) a lower surface of the display panel.

The lower plate may include a base substrate on which patterns may be defined, and a functional layer disposed on an upper surface of the base substrate, wherein the functional layer may include at least one of an etch-stop layer and a laser light shielding layer.

The lower plate may include glass.

At least some of the plurality of patterns may penetrate from a lower surface of the lower plate toward an upper surface of the lower plate.

At least some of the plurality of patterns may have a concave shape in a direction from a lower surface of the lower plate toward an upper surface of the lower plate.

The display device may further include an adhesive layer disposed between the lower plate and the display panel, wherein the lower plate may be coupled to the lower portion of the display panel by the adhesive layer.

The lower plate may include a base substrate in which the patterns may be defined, a first conductive layer disposed on an upper surface of the base substrate and including first conductive patterns, a first insulating layer disposed on the upper surface of the base substrate and covering the first conductive patterns, a second conductive layer disposed on a lower surface of the base substrate and including second conductive patterns, and a second insulating layer disposed on the lower surface of the base substrate and covering the second conductive patterns.

The lower plate may include a support portion overlapping the display panel and a protrusion portion at least partially not overlapping the display panel, and a thickness of the protrusion portion may be greater than or equal to a thickness of the support portion.

The display device may further include an electrode disposed on an upper surface of the protrusion portion and electrically connected to the display panel, and a circuit film coupled to the electrode and a side surface of the protrusion portion and electrically connected to the electrode.

According to an embodiment, a display device may include a display panel in which a first non-folding area, a folding area, and a second non-folding area may be sequentially defined in a first direction, and a lower plate coupled to a lower portion of the display panel and including a base substrate in which multiple patterns overlapping the folding area may be defined, and a functional layer disposed on an upper surface of the base substrate, wherein the functional layer may contact (e.g., directly contacts) the display panel.

The functional layer may include amorphous silicon.

According to an embodiment, a method of manufacturing a display device may include forming a lower plate, and forming a display panel, wherein the display panel may be formed on (e.g., directly formed on) to the lower plate, the forming of the lower plate may include forming multiple patterns by removing a portion of the lower plate, and a minimum width of the display panel in a first direction may be smaller than a minimum width of the lower plate in the first direction.

The forming of the display panel may include forming a base layer directly on an upper surface of the lower plate by coating a base material onto the upper surface, forming a circuit layer on the base layer, forming an element layer on the circuit layer; and forming an encapsulation layer on the element layer.

The method may further include forming an electrode electrically connected to the circuit layer of the display panel on the upper surface of the lower plate, and coupling a circuit film to the electrode and a side surface of the lower plate.

The forming of the lower plate may further include preparing a base substrate including a first portion overlapping the display panel and a second portion extending from the first portion, forming an etch-stop layer on a lower surface of the second portion of the base substrate, and removing a portion of the first portion of the base substrate in a thickness direction, wherein the circuit film may be coupled to a side surface of the second portion.

The method may further include forming an acid resistant layer covering the display panel after coupling the display panel and the lower plate, and removing the acid resistant layer, wherein the forming of the patterns is performed in a state where the acid resistant layer is formed.

The forming of the patterns may include irradiating a laser while the display panel and the lower plate are coupled, and etching the lower plate irradiated by the laser.

The forming of the lower plate may further include irradiating a laser onto the lower plate, wherein the display panel may be formed on the lower plate after the irradiating the laser onto the lower plate, and the patterns may be formed after the display panel is formed on the lower plate.

The forming of the lower plate may further include providing a base substrate, and forming a functional layer on the base substrate, wherein the patterns may be formed after the forming the functional layer on the base substrate, and the functional layer may include at least one of an etch-stop layer and a laser light shielding layer.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1A:
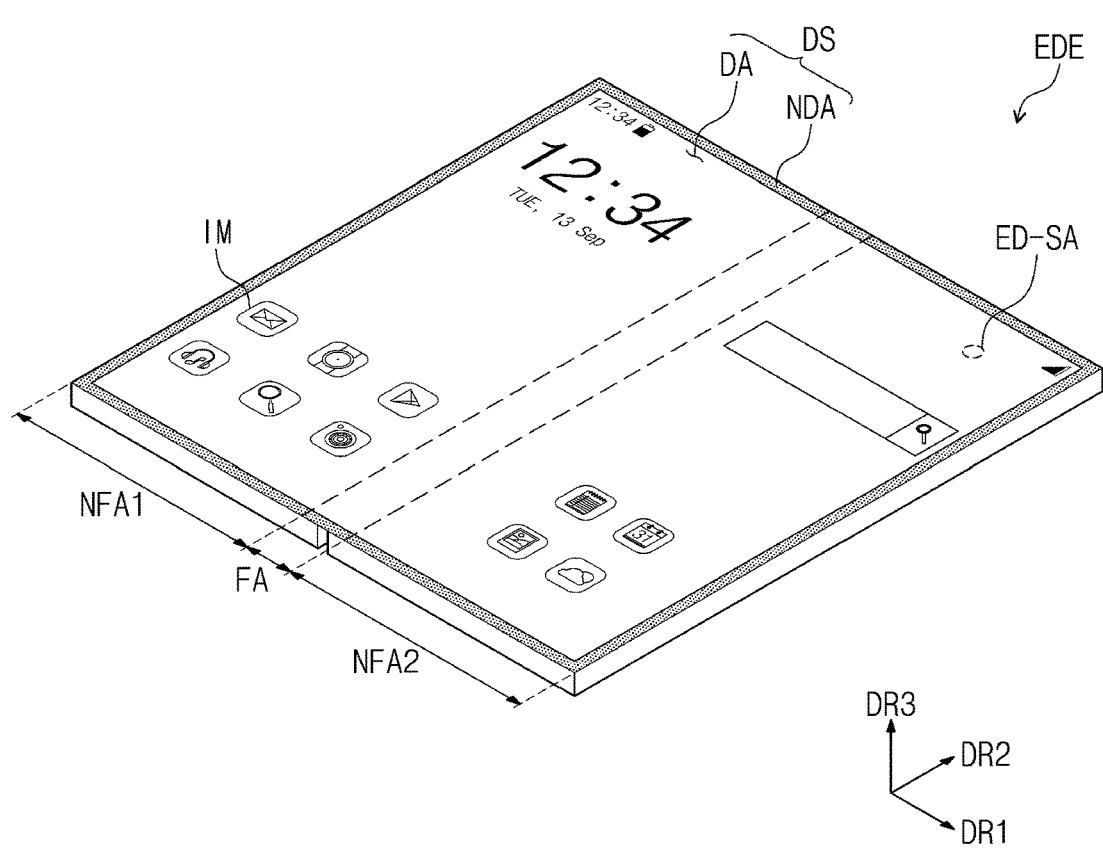
FIGS. 1A and 1B are perspective views of an electronic device according to an embodiment of the disclosure.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in an embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be predisposed differently from the described order. For example, two consecutively described processes may be predisposed substantially at the same time or predisposed in an order opposite to the described order. Also, like reference numerals and/or reference characters denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element. Further, the X-axis, the Y-axis, and the Z-axis may not be limited to three axes of a rectangular coordinate system, such as the x, y, and z axes, and may be interpreted in a broader sense. For example, the X-axis, the Y-axis, and the Z-axis may be perpendicular to one another, or may be different directions that may not be perpendicular to one another.

For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items. A description that a component is "configured to" perform a specified operation may be defined as a case where the component is constructed and arranged with structural features that can cause the component to perform the specified operation.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, may not be necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be disposed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, portion, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein. Hereinafter, embodiments of the disclosure will be described in detail with reference to the accompanying drawings.

Figure 1B:
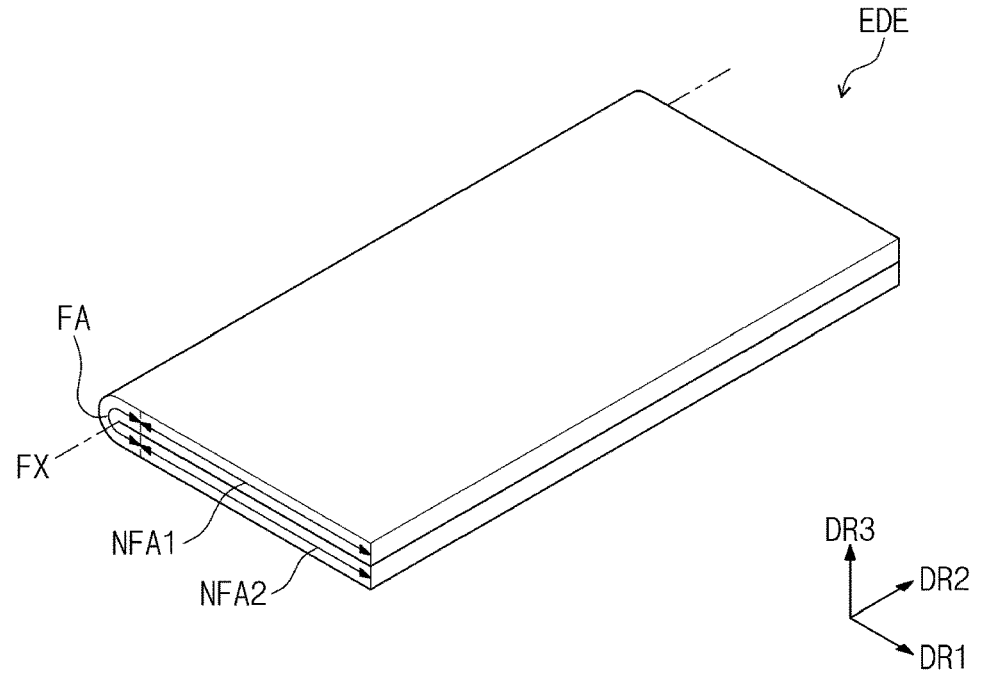

FIGS. 1A and 1B are perspective views of an electronic device EDE according to an embodiment of the disclosure. FIG. 1A illustrates a spread (or unfolded) state of the electronic device EDE, and FIG. 1B illustrates a folded state of the electronic device EDE.

Referring to FIGS. 1A and 1B, the electronic device EDE according to an embodiment of the disclosure may include a display surface DS in which a first direction DR1 and a second direction DR2 intersecting the first direction DR1 may be defined. The electronic device EDE may provide an image IM to the user through the display surface DS.

The display surface DS may include a display area DA and a non-display area NDA around the display area DA. The display area DA may display the image IM, and the non-display area NDA may not display the image IM. The non-display area NDA may surround the display area DA. However, the embodiment may not be limited thereto, and the shapes of the display area DA and the non-display area NDA may be modified.

Hereinafter, a direction substantially perpendicular to the plane defined by the first and second directions DR1 and DR2 may be defined as a third direction DR3. In the disclosure, the phrase "on a plane" may be defined as a state viewed from the third direction DR3 corresponding to a plan view.

A sensor area ED-SA may be defined within the display area DA of the electronic device EDE. Although one sensor area ED-SA may be illustrated in FIG. 1A as an example, the number of sensor areas ED-SA may not be limited thereto. The sensor area ED-SA may be a portion of the display area DA. Accordingly, the electronic device EDE may display an image through the sensor area ED-SA. However, the embodiment may not be limited thereto. For example, a portion of the display panel corresponding to the sensor area ED-SA may instead be removed so that the sensor area ED-SA may not display an image.

An electronic module (e.g., EM2 of FIG. 2B) may be disposed in an area overlapping the sensor area ED-SA. The electronic module may receive an external input transmitted through the sensor area ED-SA or provide an output through the sensor area ED-SA. For example, the electronic module may be a camera module, a sensor for measuring distance such as a proximity sensor, a sensor for recognizing a portion (e.g., a fingerprint, iris, or face) of a user's body, or a small lamp for outputting light, but may not be particularly limited thereto. Hereinafter, an example in which the electronic module overlapping the sensor area ED-SA may be a camera module will be described.

The electronic device EDE may include a folding area FA and multiple non-folding areas NFA1 and NFA2. The non-folding areas NFA1 and NFA2 may include the first non-folding area NFA1 and the second non-folding area NFA2. The folding area FA may be disposed between the first non-folding area NFA1 and the second non-folding area NFA2. The folding area FA may be referred to as a foldable area, and the first and second non-folding areas NFA1 and NFA2 may be referred to as first and second non-foldable areas.

As shown in FIG. 1B, the folding area FA may be folded based on a folding axis FX parallel to the second direction DR2. In case that the electronic device EDE may be folded, the folding area FA has a curvature and radius of curvature. The first non-folding area NFA1 and the second non-folding area NFA2 may face each other, and the electronic device EDE may be inner-folded so that the display surface DS may not be exposed to the outside.

In an embodiment of the disclosure, the electronic device EDE may instead be out-folded so that the display surface DS may be exposed to an outside. In an embodiment of the disclosure, the electronic device EDE may be in-folded or out-folded by a folding operation, but may not be limited thereto. In an embodiment of the disclosure, the electronic device EDE may be configured to select any one of an in-folding operation and an out-folding operation as a folding operation. In an embodiment of the disclosure, multiple folding axes may be defined in the electronic device EDE, and the electronic device EDE may be in-folded or out-folded by a folding operation on each of the folding axes.

Figure 2A:
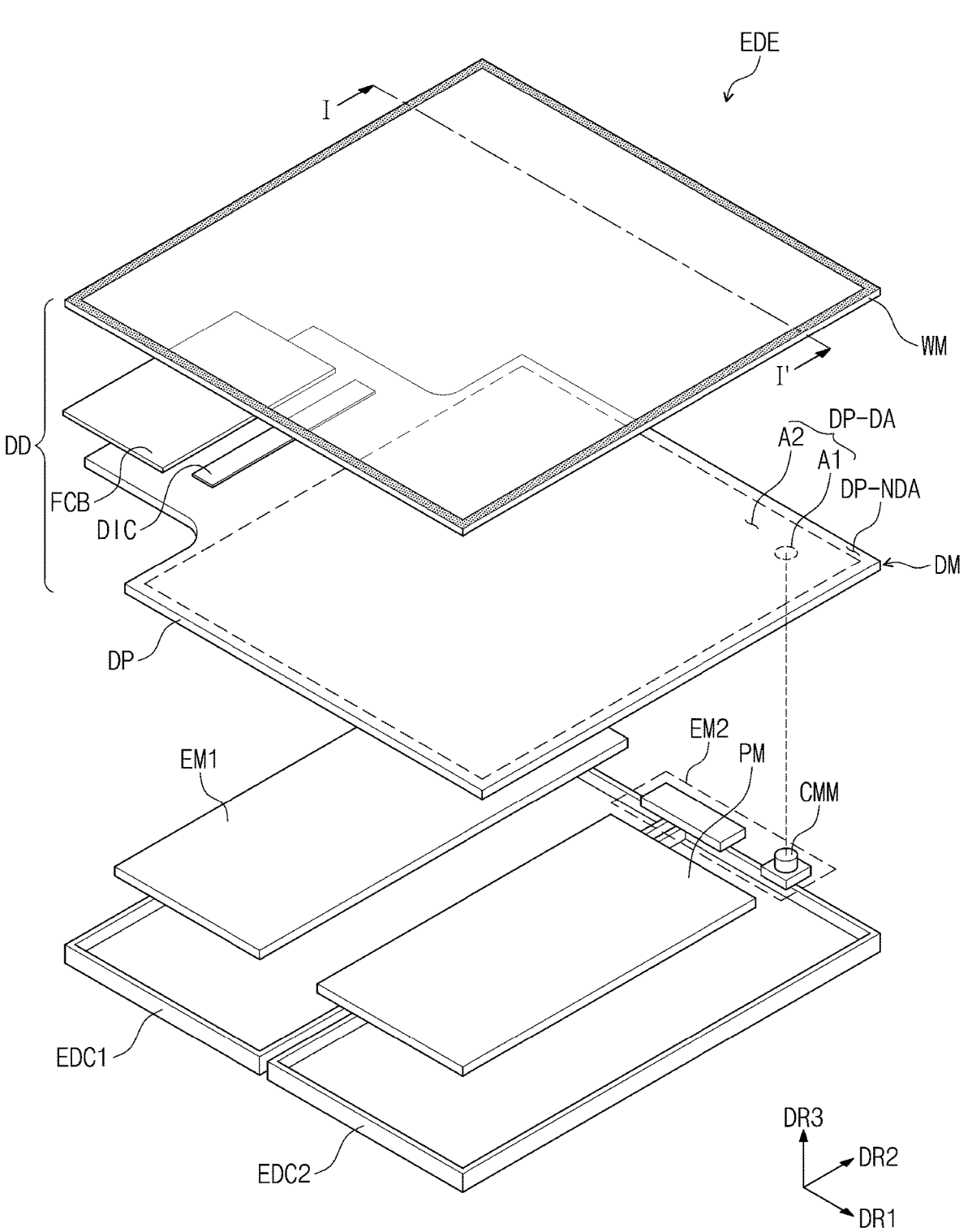
FIG. 2A is an exploded perspective view of an electronic device according to an embodiment of the disclosure.
Figure 2B:
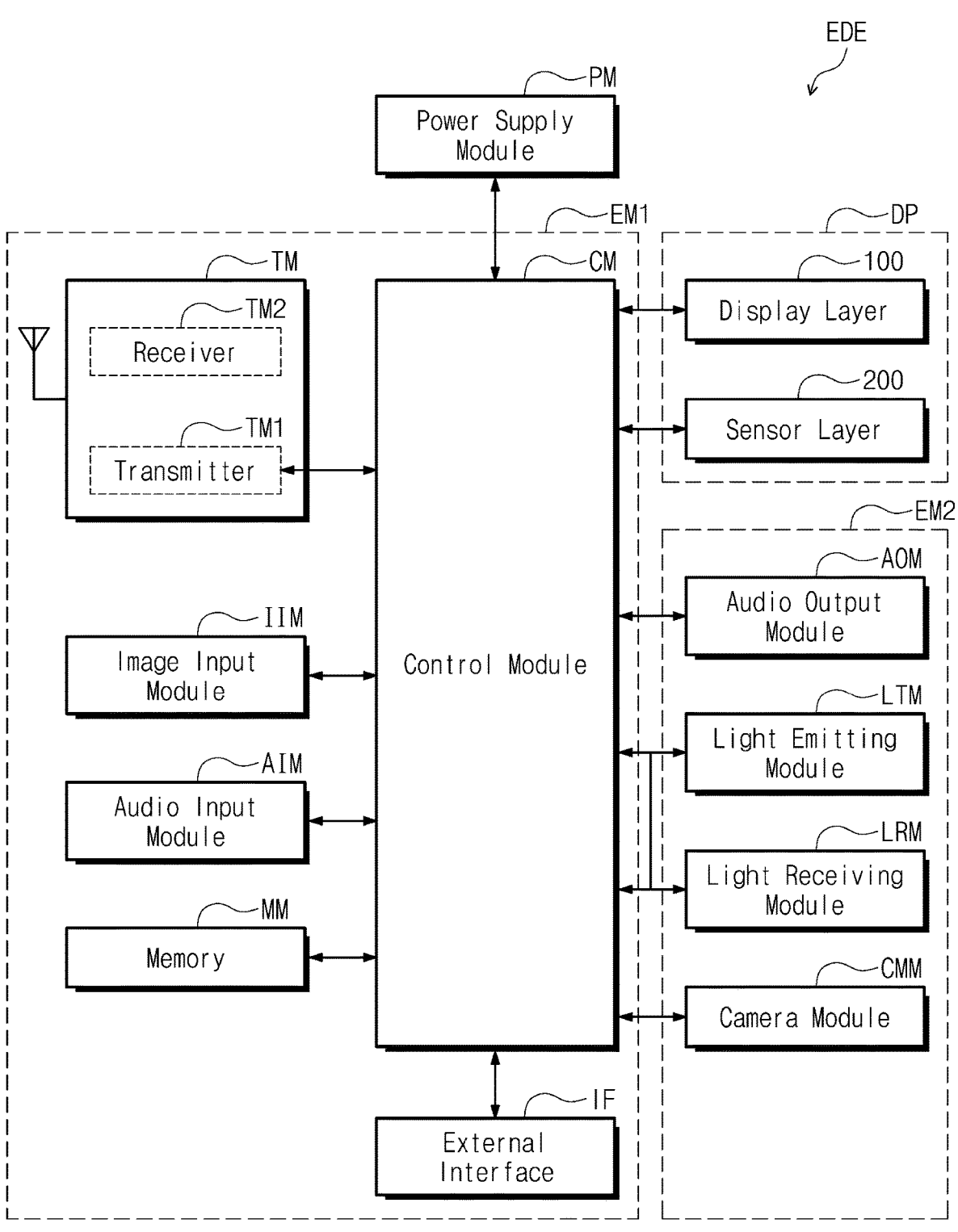
FIG. 2B is a schematic block diagram of an electronic device according to an embodiment of the disclosure.

FIG. 2A is an exploded perspective view of the electronic device EDE according to an embodiment of the disclosure, and FIG. 2B is a schematic block diagram of an electronic device EDE according to an embodiment of the disclosure. Referring to FIGS. 2A and 2B, the electronic device EDE may include a display device DD, a first electronic module EM1, a second electronic module EM2, a power supply module PM, and housings EDC1 and EDC2. The electronic device EDE may further include a mechanism structure for controlling a folding operation of the display device DD.

The display device DD may include a window module WM and a display module DM. The window module WM may provide a front surface of the electronic device EDE. The display module DM may include at least a display panel DP. The display module DM may generate an image and detect an external input.

Although FIG. 2A illustrates the display module DM being the same as the display panel DP, the display module DM may substantially be a stacked structure in which multiple components including the display panel DP may be stacked on each other. A detailed description of the stacked structure of the display module DM will be described later.

The display panel DP includes a display area DP-DA and a non-display area DP-NDA that correspond to the display area DA (FIG. 1A) and the non-display area NDA (FIG. 1A) of the electronic device EDE, respectively. In the specification, the sentence "area/portion and area/portion correspond to each other" means that they overlap, and may not be limited to the same area.

The display area DP-DA may include a first area A1 and a second area A2. The first area A1 may overlap or correspond to the sensor area ED-SA (FIG. 1A) of the electronic device EDE. In the embodiment, the first area A1 may be illustrated as a circle, but may instead have various other shapes such as a polygon, an ellipse, a figure having at least one curved side, an irregular shape, or the like, but may not be limited to the above. The first area A1 may be referred to as a component area, and the second area A2 may be referred to as a main display area or a general display area.

The first area A1 may have higher transmittance than the second area A2. The resolution of the first area A1 may be lower than that of the second area A2, but may not be limited thereto. For example, the first area A1 has a higher transmittance than the second area A2, but the resolution of the first area A1 may be substantially the same as that of the second area A2. The first area A1 may overlap a camera module CMM to be described later. In an embodiment of the disclosure, a portion of the display panel DP corresponding to the first area A1 may be removed. Therefore, any images may not be displayed in the first area A1.

The display panel DP may include a display layer 100 and a sensor layer 200. The display layer 100 may be configured to substantially generate an image. The display layer 100 may be a light emitting display layer. For example, the display layer 100 may include an organic light emitting display layer, an inorganic light emitting display layer, an organic-inorganic light emitting display layer, a quantum dot display layer, a micro LED display layer, or a nano LED display layer. The sensor layer 200 may detect an external input applied from an outside. The external input may be a user's input. The user's input may include various types of external inputs, such as a part of the user's body, light, heat, pen, or pressure.

The display module DM may include a driving chip DIC disposed on the non-display area DP-NDA. The display module DM may further include a flexible circuit film FCB coupled to the non-display area DP-NDA. The driving chip DIC may include driving elements for driving pixels of the display panel DP, for example, a data driving circuit. Although FIG. 2A illustrates a structure in which the driving chip DIC may be mounted on the display panel DP, the embodiment may not be limited thereto. For example, the driving chip DIC may be mounted on the flexible circuit film FCB.

The power supply module PM supplies power necessary for the overall operation of the electronic device EDE. The power supply module PM may include a conventional battery module.

The first electronic module EM1 and the second electronic module EM2 include various functional modules for operating the electronic device EDE. Each of the first electronic module EM1 and the second electronic module EM2 may be mounted (e.g., directly mounted) on a motherboard electrically connected to the display panel DP or electrically connected to the motherboard through a connector (not shown) while being mounted on a separate substrate. The first electronic module EM1 may include a control module CM, a wireless communication module TM, an image input module IIM, an audio input module AIM, a memory MM, and an external interface IF.

The control module CM controls the overall operation of the electronic device EDE. The control module CM may be a microprocessor. For example, the control module CM activates or deactivates the display panel DP. The control module CM may control other modules such as the image input module IIM, the audio input module AIM, or the like based on the touch signal received from the display panel DP.

The wireless communication module TM may communicate with an external electronic device through a first network (e.g., a short-range communication network such as Bluetooth, WiFi direct, or infrared data association (IrDA)) or a second network (e.g., a cellular network, the Internet, or a telecommunications network such as a computer network (e.g., LAN or WAN)). Communication modules included in the wireless communication module TM may be integrated as one component (e.g., a single chip) or implemented as multiple components (e.g., multiple chips) separated from each other. The wireless communication module TM may transmit/receive voice signals by using a general communication line. The wireless communication module TM may include a transmitter TM1 for modulating and transmitting a signal to be transmitted and a receiver TM2 for demodulating a received signal.

The image input module IIM processes the image signal to convert the image signal into image data that can be displayed on the display panel DP. The audio input module AIM receives an external sound signal through a microphone in a recording mode, a voice recognition mode, and the like, and converts the sound signal into electrical voice data.

The external interface IF may include a connector capable of physically connecting the electronic device EDE to an external electronic device. For example, the external interface IF may serve as an interface electrically connected to an external charger, a wired/wireless data port, a card (e.g., a memory card, or a SIM/UIM card) socket, and the like.

The second electronic module EM2 may include an audio output module AOM, a light emitting module LTM, a light receiving module LRM, and the camera module CMM. The audio output module AOM may convert the audio data received from the wireless communication module TM or the audio data stored in the memory MM and may output the audio data to an outside.

The light emitting module LTM may generate and output light. The light emitting module LTM may output infrared light. The light emitting module LTM may include an LED device. The light receiving module LRM may detect infrared rays. The light receiving module LRM may be activated in case that infrared rays of a level or higher may be detected. The light receiving module LRM may include a CMOS sensor. After the infrared light generated by the light emitting module LTM may be output, the infrared light may be reflected by an external object (e.g., a user's finger or face), and the reflected infrared light may be incident into the light receiving module LRM.

The camera module CMM may take still images and moving images. Multiple camera modules CMM may be provided. Some of the camera modules CMM may overlap the first area A1. An external input (e.g., light) may be provided to the camera module CMM through the first area A1. For example, the camera module CMM may photograph an external image by receiving natural light through the first area A1.

The housings EDC1 and EDC2 may accommodate the display module DM, the first and second electronic modules EM1 and EM2, and the power supply module PM. The housings EDC1 and EDC2 protect components accommodated in the housings EDC1 and EDC2, such as the display module DM, the first and second electronic modules EM1 and EM2, and the power supply module PM. Although FIG. 2A illustrates two housings EDC1 and EDC2 separated from each other, the embodiment may not be limited thereto. Although not shown, the electronic device EDE may further include a hinge structure for connecting the two housings EDC1 and EDC2. The housings EDC1 and EDC2 may be coupled to the window module WM.

Figure 3:
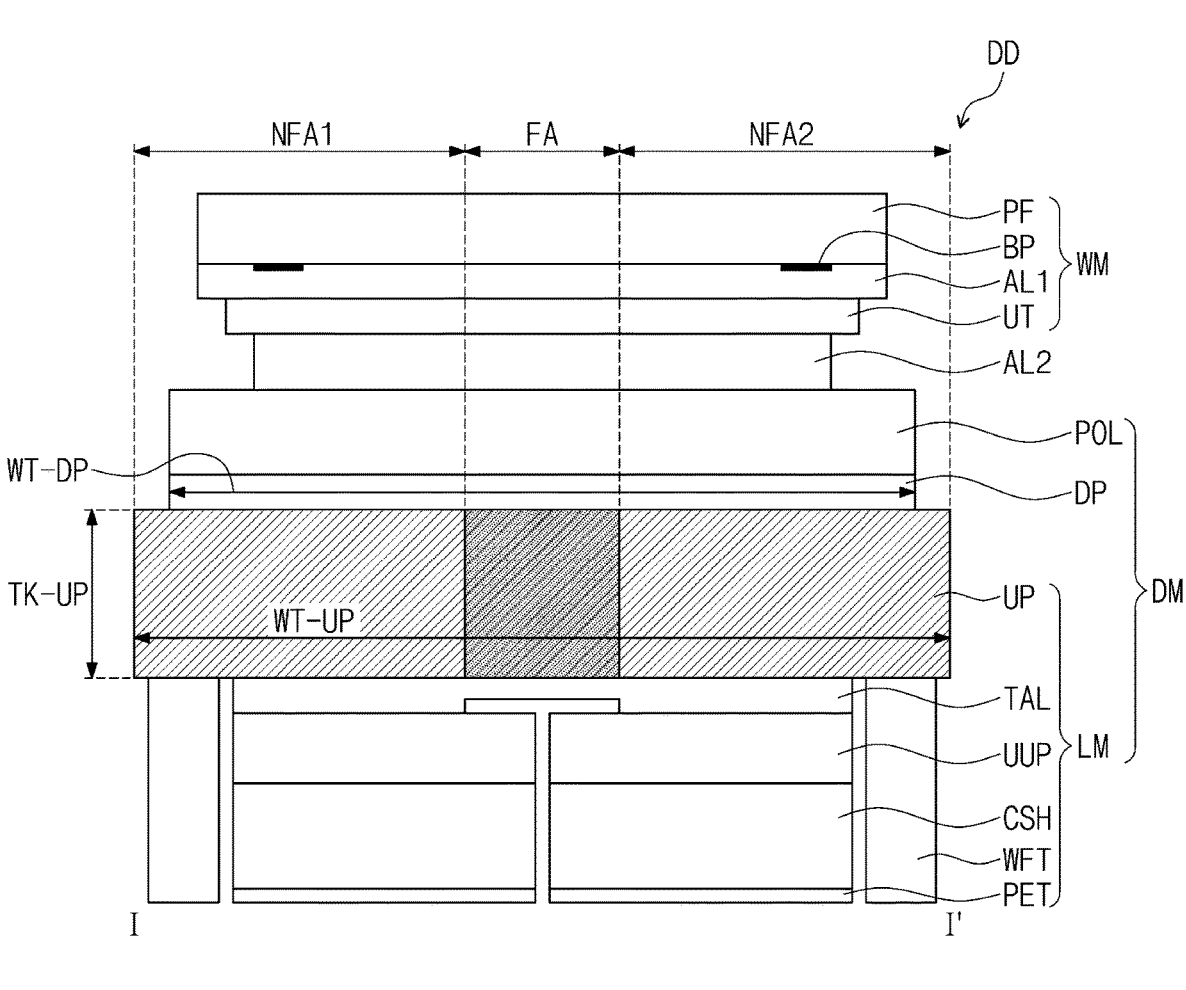
FIG. 3 is a schematic cross-sectional view of a display device according to an embodiment of the disclosure.
Figure 3:
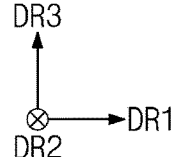

FIG. 3 is a schematic cross-sectional view of the display device DD according to an embodiment of the disclosure. FIG. 3 is a schematic cross-sectional view of the display device DD taken along line I-I' of FIG. 2A according to an embodiment of the disclosure. Referring to FIG. 3, the display device DD may include the window module WM and the display module DM.

The window module WM may include a window UT, a protective film PF disposed on the window UT, and a bezel pattern BP. The window UT may be chemically strengthened glass. As the window UT may be applied to the display device DD, generation of wrinkles may be minimized even in case that folding and unfolding are repeated. The protective film PF may include polyimide, polycarbonate, polyamide, triacetylcellulose, polymethylmethacrylate, polyethylene terephthalate, or a combination thereof. Although not separately illustrated, at least one of a hard coating layer, an anti-fingerprint layer, and an anti-reflection layer may be disposed on the upper surface of the protective film PF.

The bezel pattern BP may overlap the non-display area NDA (see FIG. 1A). The bezel pattern BP may be disposed on a surface of the window UT or a surface of the protective film PF. FIG. 3 illustrates the bezel pattern BP disposed on the lower surface of the protective film PF as an example. Without being limited thereto, the bezel pattern BP may instead be disposed on the upper surface of the protective film PF, the upper surface of the window UT, or the lower surface of the window UT. The bezel pattern BP may be formed as a colored light blocking layer, for example, by a coating technique. The bezel pattern BP may include a base material and a dye or pigment mixed with the base material. The bezel pattern BP may have a closed line shape (or closed shape) on a plane. In an embodiment of the disclosure, the bezel pattern BP may be omitted.

A first adhesive layer AL1 may be disposed between the protective film PF and the window UT. The first adhesive layer AL1 may be a pressure sensitive adhesive film (PSA) or an optically clear adhesive (OCA). The adhesive layers described below also may be the same as the first adhesive layer AL1 and may include a conventional adhesive. The first adhesive layer AL1 may have a thickness sufficient to cover the bezel pattern BP. For example, the thickness of the bezel pattern BP may be about 3 micrometers to about 8 micrometers, and the first adhesive layer AL1 may have a thickness at which bubbles may not be generated in the periphery of the bezel pattern BP. The first adhesive layer AL1 may be separated from the window UT. Because the strength of the protective film PF may be lower than that of the window UT, scratches may occur readily. After the first adhesive layer AL1 and the damaged protective film PF may be separated from the window UT, a new protective film PF may be attached to the window UT.

The display module DM may include an anti-reflection layer POL, the display panel DP, and a lower member LM.

The anti-reflection layer POL may prevent transmission or reflection of light reflected on the inside of the display panel DP and/or the electronic device or light incident from the outside of the display panel DP and/or the electronic device. In an embodiment of the disclosure, the anti-reflection layer POL may be disposed on the display panel DP. The anti-reflection layer POL may be coupled to the window UT through a second adhesive layer AL2. The anti-reflection layer POL may include a phase retarder and/or a polarizer. The anti-reflection layer POL may include at least a polarizing film. The anti-reflection layer POL may be attached to the display panel DP through an adhesive layer. In an embodiment of the disclosure, the anti-reflection layer POL may be omitted. In an embodiment of the disclosure, the anti-reflection layer POL may be included in the display panel DP. The anti-reflection layer POL may include multiple color filters or a reflection control layer.

The lower member LM may be disposed below the display panel DP. The lower member LM may include a lower plate UP, a cover layer TAL, division plates UUP, cushion layers CSH, protective layers PET, and waterproof tape WFT. In an embodiment of the disclosure, the lower member LM may not include some of the above-described components or may further include other components. The stacking sequence shown in FIG. 3 may be only, for example, a sequence except for the lower plate UP, and the stacking sequence of each component may be changed.

The lower plate UP may be disposed under the display panel DP. The lower plate UP supports elements disposed above the lower plate UP and maintains the unfolded and folded states of the display device DD. The lower plate UP may include a rigid material. The lower plate UP may include a material having an elastic modulus of about 10 GPa or more. For example, the lower plate UP may include glass. In the case of glass, the surface quality may be relatively better than that of carbon fiber reinforced plastic. Accordingly, the surface quality of the display device DD may be improved by disposing the lower plate UP including glass under the display panel DP. Although glass has been described as an example of the material constituting the lower plate UP, the material constituting the lower plate UP may not be particularly limited thereto. A thickness TK-UP of the lower plate UP may be about 50 micrometers to about 400 micrometers, but may not be particularly limited thereto.

In case that the lower plate UP may be disposed under (e.g., directly under) the display panel DP, even though an impact occurs at the top of the display panel DP, the change in stress at the bottom of the display panel DP may not be large. Therefore, defects occurring in the display panel DP due to impact from the top may be reduced. Because the lower plate UP may be disposed (e.g., directly disposed) under the display panel DP, the protective or cover film having a lower modulus of elasticity than the lower plate UP may be omitted between the display panel DP and the lower plate UP.

The lower plate UP may include at least a first support portion corresponding to the first non-folding area NFA1, a second support portion corresponding to the second non-folding area NFA2, and a folding portion corresponding to the folding area FA. The first support portion and the second support portion may be spaced apart from each other in the first direction DR1. The folding portion may be disposed between the first support portion and the second support portion, and multiple patterns may be defined in the folding portion. Flexibility of a portion of the lower plate UP may be improved by the plurality of patterns. For example, flexibility of a portion that overlaps the folding area FA of the lower plate UP may be improved by the plurality of patterns. The plurality of patterns may be provided by removing at least a portion of the lower plate UP, and a detailed description thereof will be described later.

According to an embodiment of the disclosure, a minimum width WT-DP of the display panel DP in the first direction DR1 may be smaller than a minimum width WT-UP of the lower plate UP in the first direction DR1. The lower plate UP having the minimum width WT-UP greater than the minimum width WT-DP of the display panel DP may be disposed below (e.g., directly below) the display panel DP.

The cover layer TAL may be disposed below the lower plate UP. The cover layer TAL may cover the plurality of patterns defined on the lower plate UP. Thus, the cover layer TAL may prevent foreign materials from being introduced into the plurality of patterns. The cover layer TAL may have a lower modulus of elasticity than the lower plate UP. For example, the cover layer TAL may include thermoplastic polyurethane, rubber, silicone, or a combination thereof but may not be limited thereto.

The division plates UUP may be disposed below the cover layer TAL. The division plates UUP may be spaced apart from each other at a portion overlapping the folding area FA. The cushion layers CSH may be respectively disposed below the division plates UUP. The protective layers PET may be disposed under the cushion layers CSH, respectively. The protective layers PET may be insulating layers. For example, the protective layers PET may be provided to prevent the introduction of static electricity. Accordingly, electrical interference between the flexible circuit film FCB (see FIG. 2A) and members disposed on the protective layers PET may be prevented from occurring by the protective layers PET. The waterproof tape WFT may be attached to the lower plate UP. The waterproof tape WFT may be attached to a set bracket (not shown).

Figure 4:
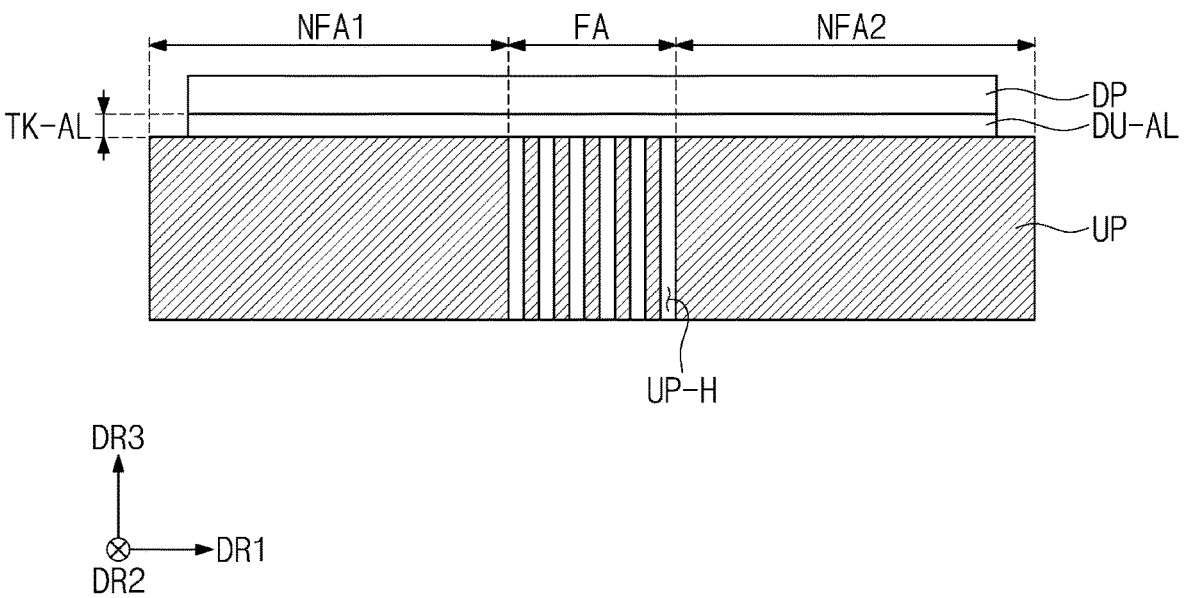
FIG. 4 is a schematic cross-sectional view illustrating some configurations of a display device according to an embodiment of the disclosure.

FIG. 4 is a schematic cross-sectional view illustrating some configurations of a display device according to an embodiment of the disclosure. Referring to FIGS. 3 and 4, the display device DD may further include an adhesive layer DU-AL disposed between the display panel DP and the lower plate UP. The lower plate UP may be coupled to a lower portion of the display panel DP by the adhesive layer DU-AL. The adhesive layer DU-AL may include an ultraviolet curable adhesive, but may not be particularly limited thereto.

The thinner a thickness TK-AL of the adhesive layer DU-AL may be, the more advantageous it may be to impact resistance. For example, the thickness TK-AL of the adhesive layer DU-AL may be smaller than the thickness TK-UP of the lower plate UP. The thickness TK-AL of the adhesive layer DU-AL may be about 10 micrometers to about 20 micrometers, but may not be particularly limited thereto. Multiple patterns UP-H may be defined in the lower plate UP. The plurality of patterns UP-H may penetrate from the lower surface of the lower plate UP toward the upper surface of the lower plate UP.

Figure 5:
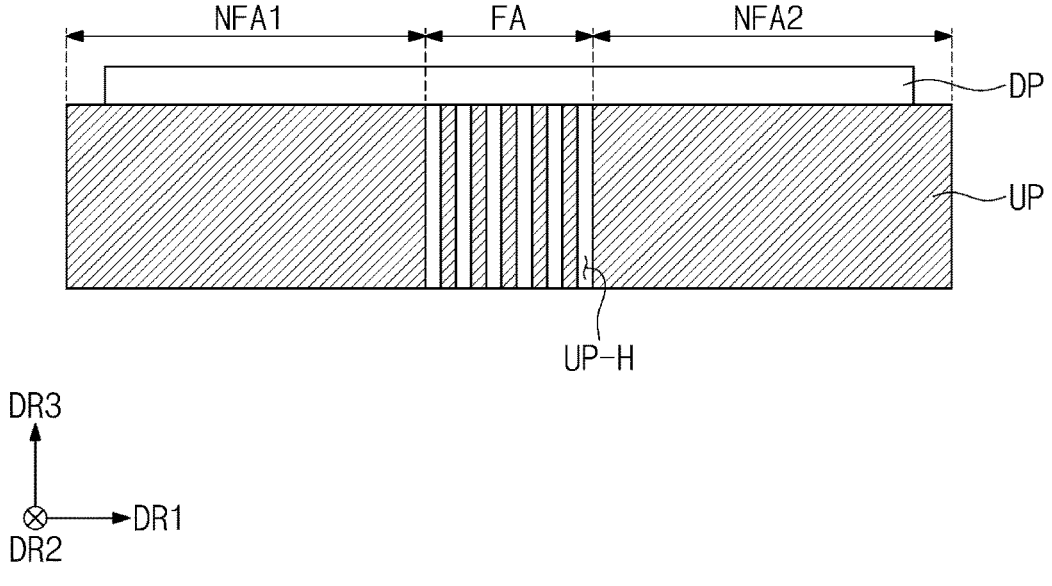
FIG. 5 is a schematic cross-sectional view illustrating some configurations of a display device according to an embodiment of the disclosure.

FIG. 5 is a schematic cross-sectional view illustrating some configurations of a display device according to an embodiment of the disclosure. Referring to FIGS. 3 and 5, the upper surface of the lower plate UP may contact (e.g., directly contact) the lower surface of the display panel DP. For example, the lower plate UP may be formed by using a carrier substrate used in manufacturing the display panel DP. Therefore, the adhesive layer may be omitted between the lower plate UP and the display panel DP. A lamination process for coupling the display panel DP and the lower plate UP may therefore be omitted, thereby simplifying the process.

Figure 6A:
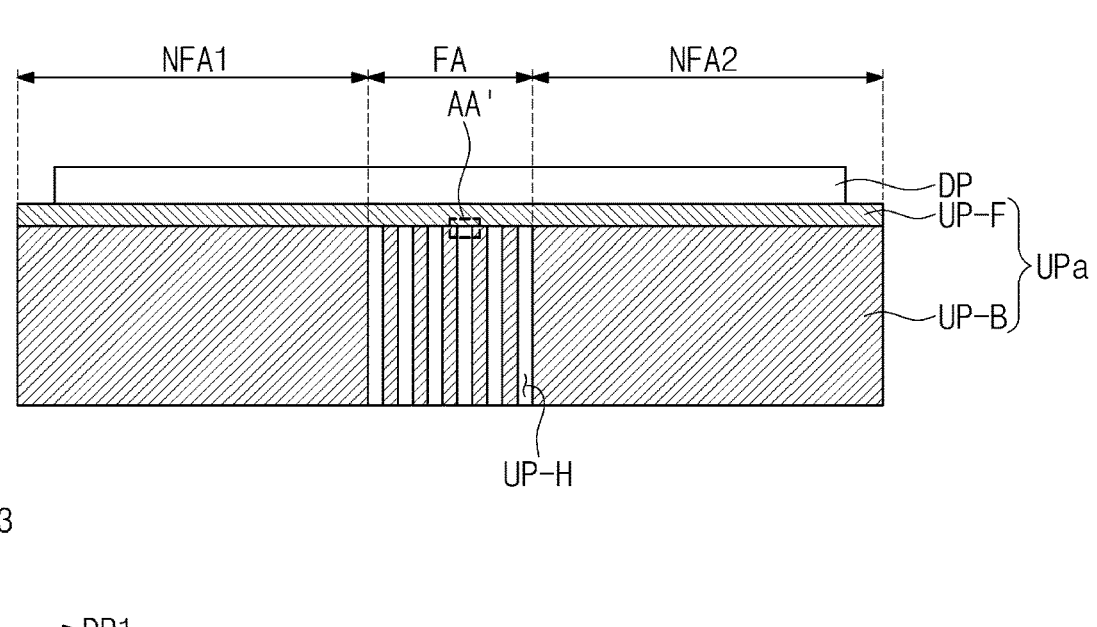
FIG. 6A is a schematic cross-sectional view illustrating some configurations of a display device according to an embodiment of the disclosure.
Figure 6B:
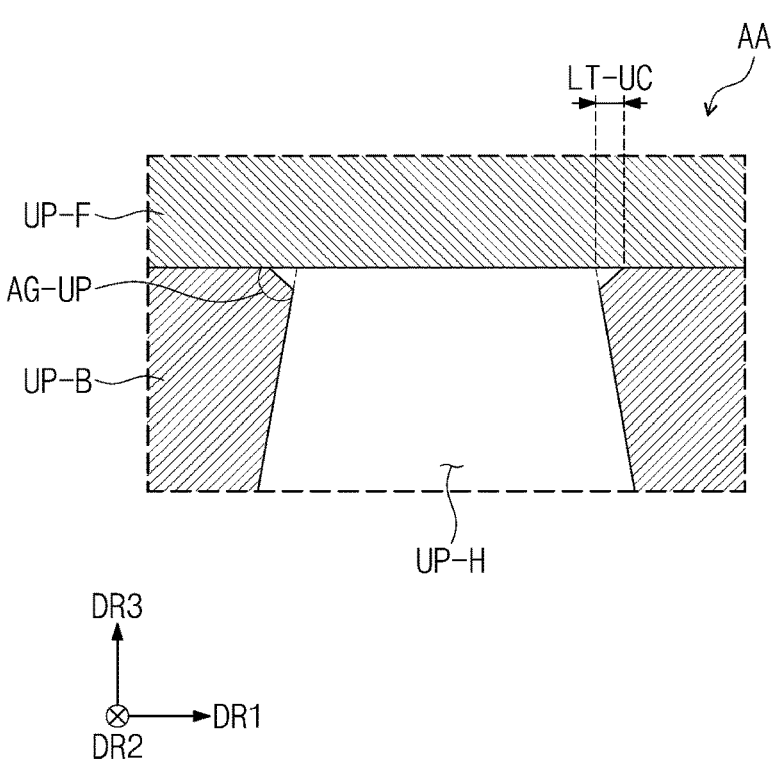
FIG. 6B is an enlarged schematic cross-sectional view of area AA' of FIG. 6A.

FIG. 6A is a schematic cross-sectional view illustrating some configurations of a display device according to an embodiment of the disclosure. FIG. 6B is an enlarged schematic cross-sectional view of area AA' of FIG. 6A. Referring to FIGS. 3, 6A, and 6B, the upper surface of a lower plate UPa may contact (e.g., directly contact) the lower surface of the display panel DP. The adhesive layer between the lower plate UPa and the display panel DP may be omitted.

The lower plate UPa may include a base substrate UP-B on which patterns UP-H may be defined and a functional layer UP-F disposed on an upper surface of the base substrate UP-B. The functional layer UP-F may include at least one of an etch-stop layer and a laser light shielding layer. For example, the functional layer UP-F may be provided as a single layer or may include multiple layers.

The base substrate UP-B may include a rigid material. The base substrate UP-B may include a material having an elastic modulus of about 10 GPa or more. For example, the base substrate UP-B may include glass, but materials constituting the base substrate UP-B may not be particularly limited thereto.

The functional layer UP-F may serve as an etch-stop in case of forming patterns UP-H on the base substrate UP-B. In an embodiment of the disclosure, the functional layer UP-F may include amorphous silicon. Reactivity between an etchant used to form the patterns UP-H and amorphous silicon may be low. Accordingly, a length LT-UC of the undercut section between the base substrate UP-B and the functional layer UP-F shown in FIG. 6B may be reduced. For example, in case of there being no functional layer UP-F, the length LT-UC of the undercut section may be about 100 micrometers or more, for example, about 187 micrometers, whereas, in case that the functional layer UP-F may be provided, the length LT-UC of the undercut section may be reduced to about several tens of micrometers, for example, about 20 micrometers. Accordingly, in case that the functional layer UP-F may be provided, shape accuracy of the plurality of patterns UP-H may be improved.

A taper angle AG-UP of each of the patterns UP-H may vary with the thickness of the functional layer UP-F. For example, as the thickness of the functional layer UP-F increases, the taper angle AG-UP may increase.

The functional layer UP-F may serve to improve adhesion between the display panel DP and the lower plate UPa. For example, in case of the adhesive force (or cohesive force) between the display panel DP and the base substrate UP-B including glass is about 10 gf/inch, the adhesive force between the display panel DP and the functional layer UP-F may be between about 970 gf/inch to about 1300 gf/inch.

Figure 7:
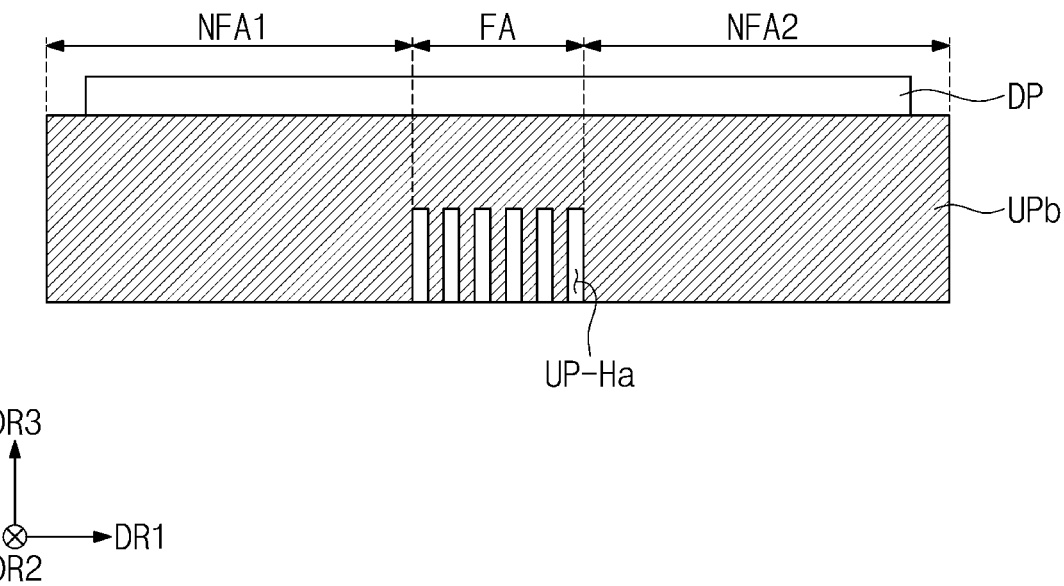
FIG. 7 is a schematic cross-sectional view illustrating some configurations of a display device according to an embodiment of the disclosure.

FIG. 7 is a schematic cross-sectional view illustrating some configurations of a display device according to an embodiment of the disclosure. Referring to FIGS. 3 and 7, multiple patterns UP-Ha may be defined in a lower plate UPb. The patterns UP-Ha may have a concave shape (e.g., recesses) in a direction from the lower surface of the lower plate UPb toward the upper surface of the lower plate UPb. The depth of each of the plurality of patterns UP-Ha may be smaller than the thickness of the lower plate UPb.

In an embodiment of the disclosure, the plurality of patterns UP-Ha may be formed in the lower plate UPb in a state in which the display panel DP is already attached to the lower plate UPb. For example, the plurality of patterns UP-Ha may be formed by irradiating the lower plate UPb with a laser and then etching it. Because the depth of each of the patterns UP-Ha to be formed may be smaller than the thickness of the lower plate UPb, damage occurring to the display panel DP during laser irradiation may be reduced. In an embodiment of the disclosure, the lower plate UP shown in FIG. 4 may be replaced with the lower plate UPb shown in FIG. 7.

Figure 8:
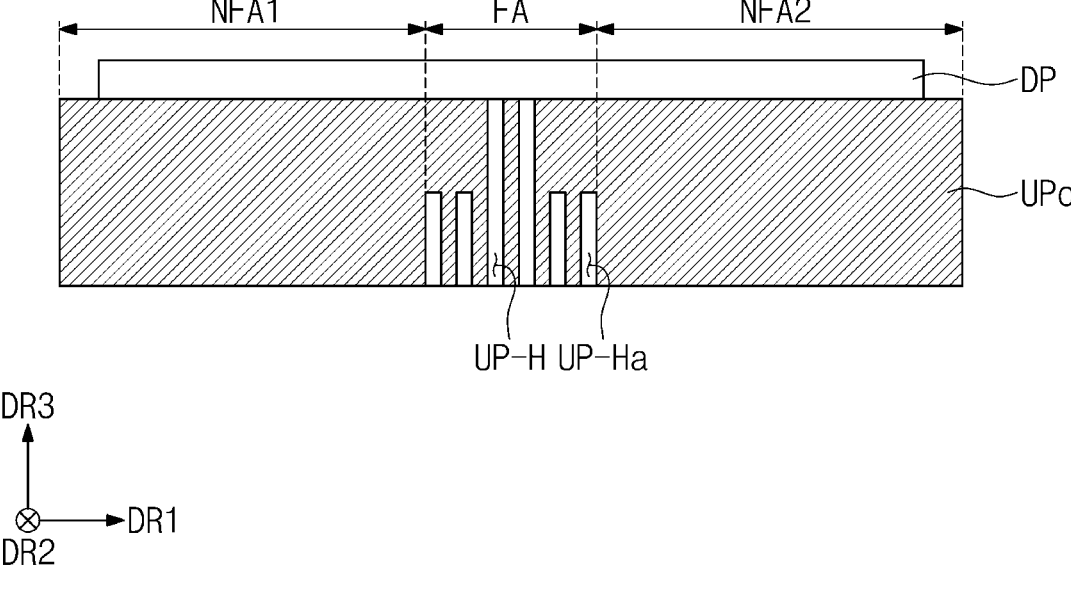
FIG. 8 is a schematic cross-sectional view illustrating some configurations of a display device according to an embodiment of the disclosure.

FIG. 8 is a schematic cross-sectional view illustrating some configurations of a display device according to an embodiment of the disclosure. Referring to FIGS. 3 and 8, the patterns UP-H and UP-Ha may be defined in a lower plate UPc. For example, some patterns UP-H among the patterns UP-H and UP-Ha may have a shape penetrating through from the lower surface of the lower plate UPc toward the upper surface of the lower plate UPc, and some patterns UP-Ha among the patterns UP-H and UP-Ha may have a concave shape (e.g., a recess) in a direction from the lower surface of the lower plate UPc toward the upper surface of the lower plate UPc. In an embodiment of the disclosure, the lower plate UP shown in FIG. 4 may be replaced with the lower plate UPc shown in FIG. 8.

Figure 9:
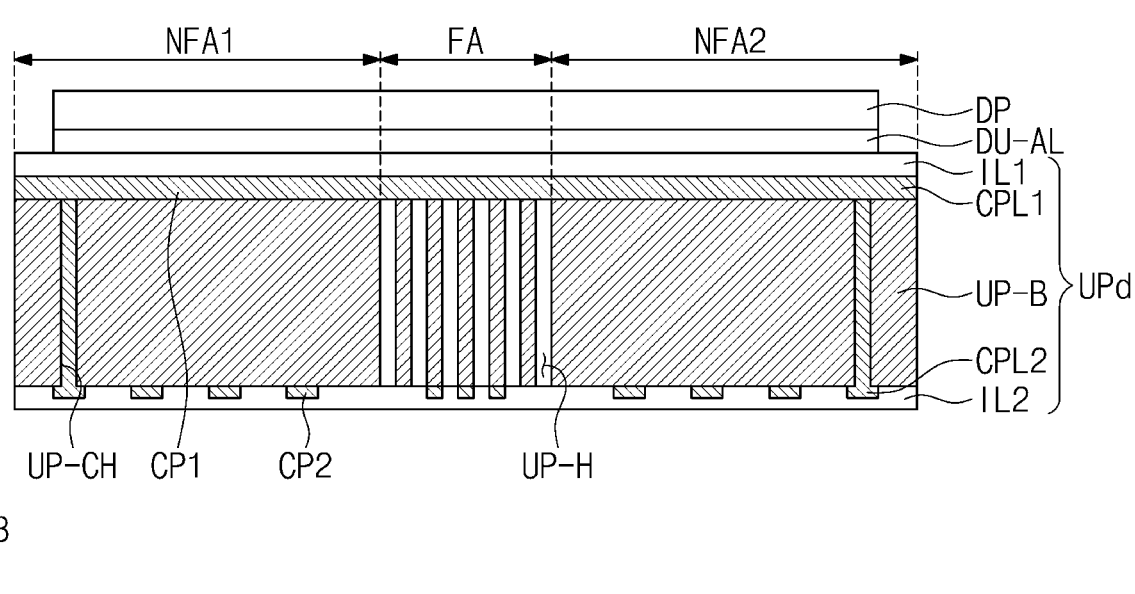
FIG. 9 is a schematic cross-sectional view illustrating some configurations of a display device according to an embodiment of the disclosure.

FIG. 9 is a schematic cross-sectional view illustrating some configurations of a display device according to an embodiment of the disclosure. Referring to FIGS. 3 and 9, a lower plate UPd may include the base substrate UP-B in which the patterns UP-H may be defined, a first conductive layer CPL1 disposed on an upper surface of the base substrate UP-B and including first conductive patterns CP1, a first insulating layer IL1 disposed on the upper surface of the base substrate UP-B and covering the first conductive patterns CP1, a second conductive layer CPL2 disposed on a lower surface of the base substrate UP-B and including second conductive patterns CP2, and a second insulating layer IL2 disposed on the lower surface of the base substrate UP-B and covering the second conductive patterns CP2.

As with the patterns UP-H, a through hole UP-CH may be formed in the base substrate UP-B. A conductive material may be disposed inside the through hole UP-CH. Accordingly, the first conductive pattern CP1 and the second conductive pattern CP2 may be electrically connected by the conductive material. The through hole UP-CH may be simultaneously formed in the same process as the patterns UP-H.

According to an embodiment of the disclosure, the lower plate UPd may function as a digitizer. For example, the first conductive layer CPL1 and the second conductive layer CPL2 may include multiple loop coils that generate a magnetic field of a preset resonant frequency with an input device (hereinafter, a pen). The magnetic field formed in the lower plate UPd may be applied to an LC resonance circuit including an inductor (coil) and a capacitor of the pen. The coil may generate a current by the received magnetic field, and transmit the generated current to the capacitor. Accordingly, the capacitor may be charged with the current input from the coil and discharges the charged current to the coil. As a result, the magnetic field of the resonant frequency may be emitted from the coil. The magnetic field emitted by the pen may be absorbed again by the loop coil of the lower plate UPd, so that it may be possible to determine which position of the lower plate UPd the pen may be close to.

Figure 10A:
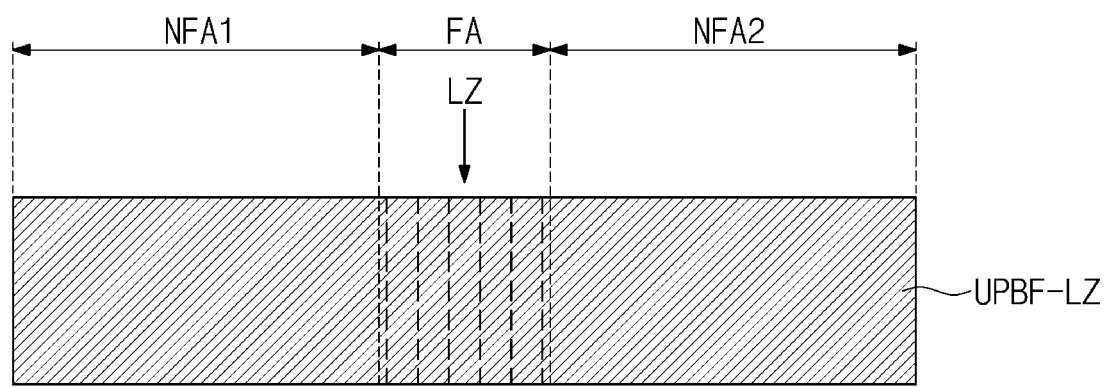
FIGS. 10A to 10D are schematic cross-sectional views illustrating a part of a method of manufacturing a display device according to an embodiment of the disclosure.
Figure 10A:
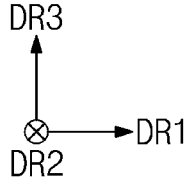
Figure 10B:
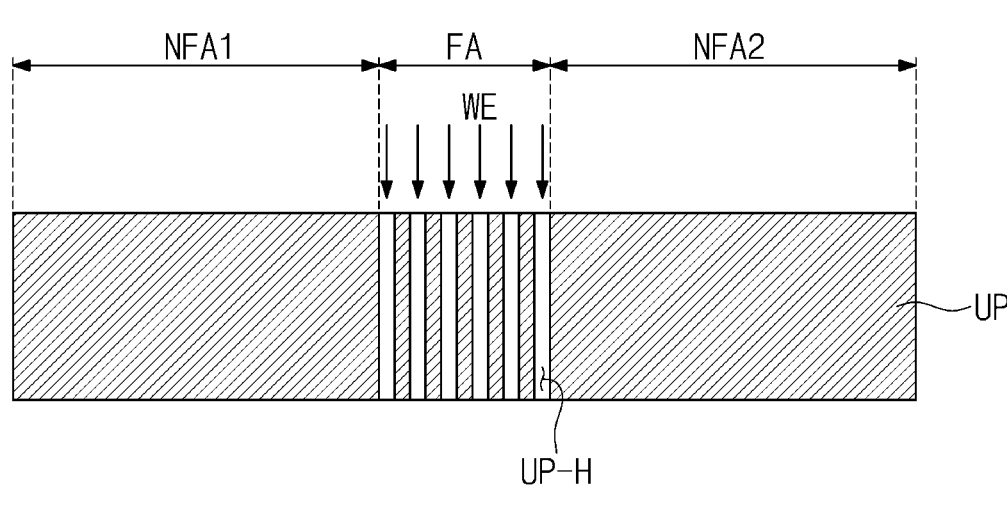
Figure 10B:
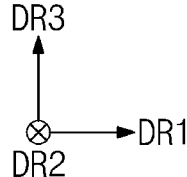
Figure 10C:
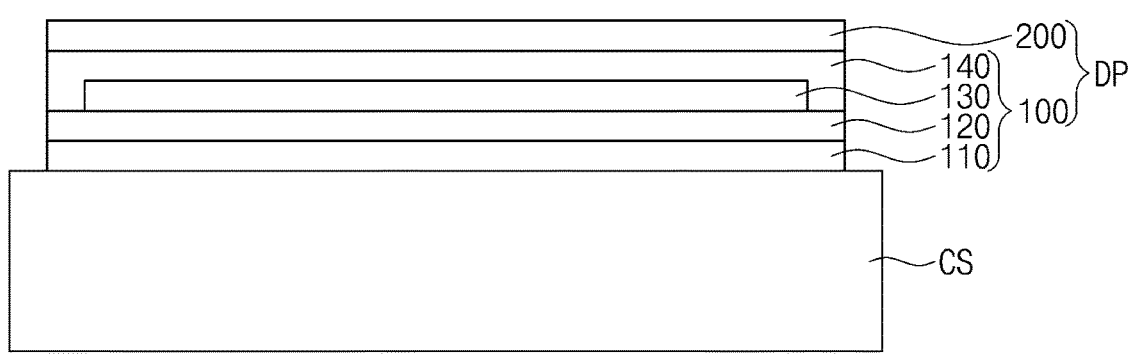
Figure 10C:
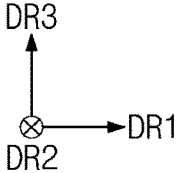
Figure 10D:
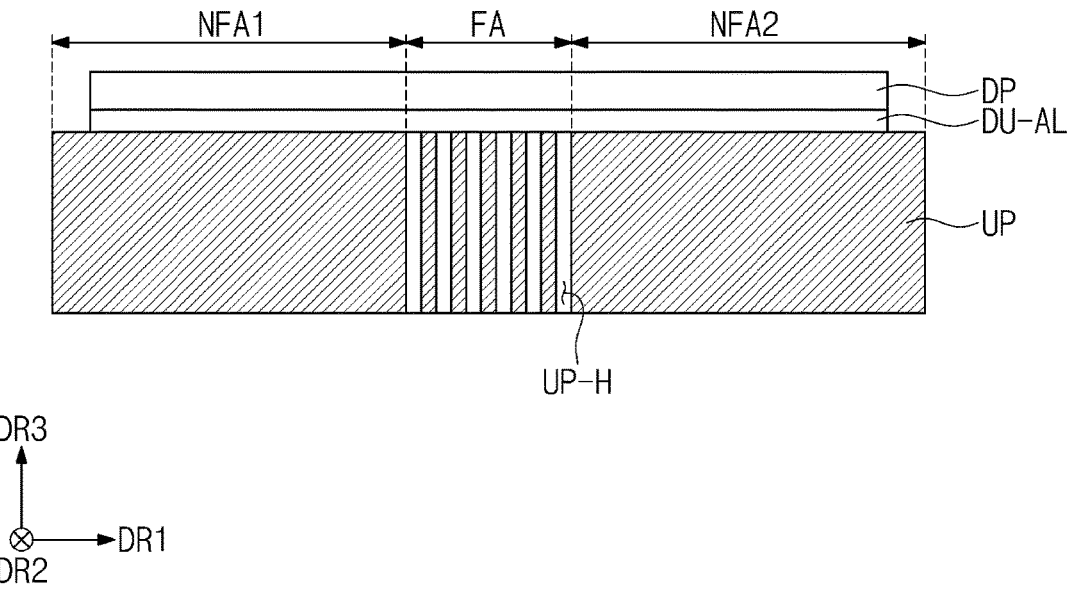

FIGS. 10A to 10D are schematic cross-sectional views illustrating a part of a method of manufacturing a display device according to an embodiment of the disclosure. FIGS. 10A and 10B illustrate an operation of forming the lower plate UP, FIG. 10C illustrates an operation of forming the display panel DP, and FIG. 10D illustrates an operation of coupling the display panel DP and the lower plate UP.

Referring to FIGS. 10A and 10B, a laser LZ may be irradiated on a first preliminary lower plate to form a second preliminary lower plate UPBF-LZ. An etchant WE may be provided to the second preliminary lower plate UPBF-LZ. Thereafter, a portion of the second preliminary lower plate UPBF-LZ may be removed to form the lower plate UP having the patterns UP-H.

Referring to FIG. 10C, a base layer 110 may be formed by applying a base material on a carrier substrate CS. The base material may include at least one of polyimide-based resin, acrylate-based resin, methacrylate-based resin, polyisoprene-based resin, vinyl-based resin, epoxy-based resin, urethane-based resin, cellulose-based resin, siloxane-based resin, polyamide-based resin, and perylene-based resin. In the specification, "X"-based resin (or the word before "-based resin") means one containing a functional group of "X". For example, "polyimide-based resin" means "a resin in the base material that may include a functional group of polyimide".

Sequentially, a circuit layer 120 may be formed on the base layer 110, a light emitting element layer 130 may be formed on the circuit layer 120, and an encapsulation layer 140 covering the light emitting element layer 130 may be formed, and the sensor layer 200 may be formed on the encapsulation layer 140. After the display panel DP is formed, the display panel DP may be separated from the carrier substrate CS.

Referring to FIG. 10D, the display panel DP and the lower plate UP may be coupled to each other by the adhesive layer DU-AL. The adhesive layer DU-AL may include an ultraviolet curable adhesive, but may not be particularly limited thereto.

Figure 11A:
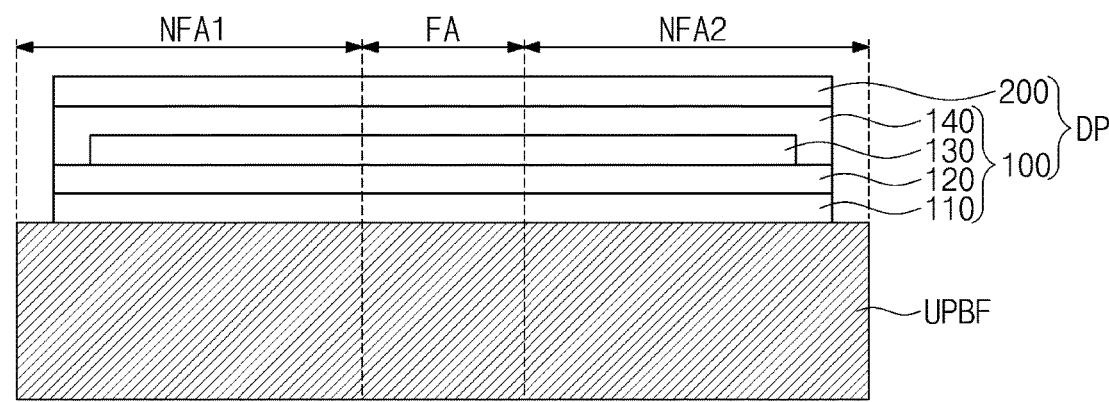
FIGS. 11A to 11E are schematic cross-sectional views illustrating a part of a method of manufacturing a display device according to an embodiment of the disclosure.
Figure 11A:
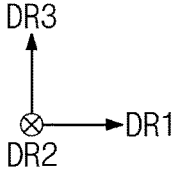

FIGS. 11A to 11E are schematic cross-sectional views illustrating a part of a method of manufacturing a display device according to an embodiment of the disclosure. Referring to FIG. 11A, the base layer 110 may be formed by applying a base material on an upper surface of a first preliminary lower plate UPBF. Accordingly, the base layer 110 may contact (e.g., directly contact) the upper surface of the first preliminary lower plate UPBF. The circuit layer 120 may be sequentially formed on the base layer 110, the light emitting element layer 130 may be formed on the circuit layer 120, the encapsulation layer 140 covering the light emitting element layer 130 may be formed, and the sensor layer 200 may be formed on the encapsulation layer 140. The display panel DP including the display layer 100 and the sensor layer 200 may be formed on the first preliminary lower plate UPBF.

Figure 11B:
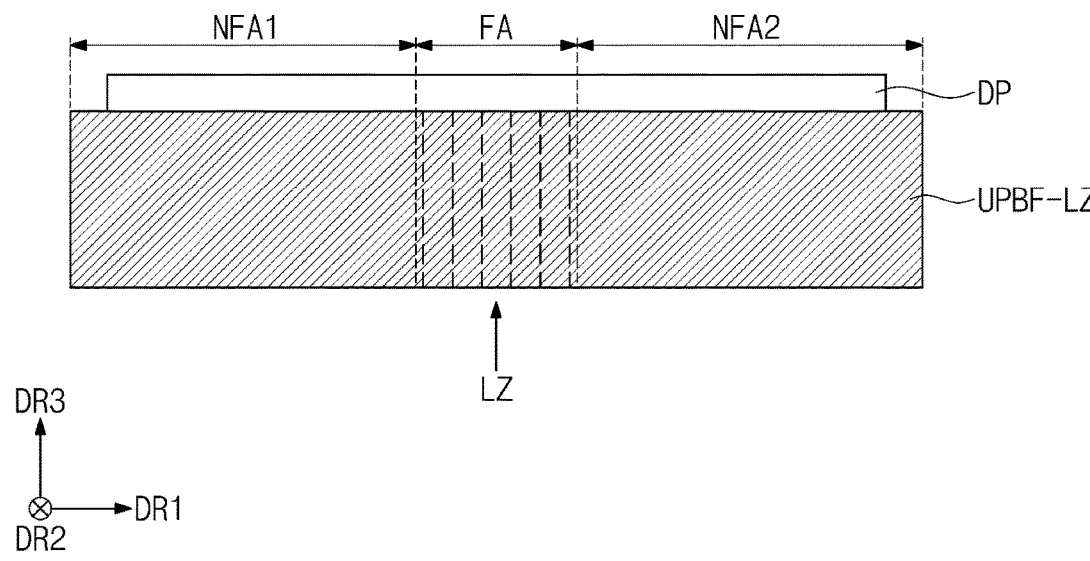
Figure 11C:
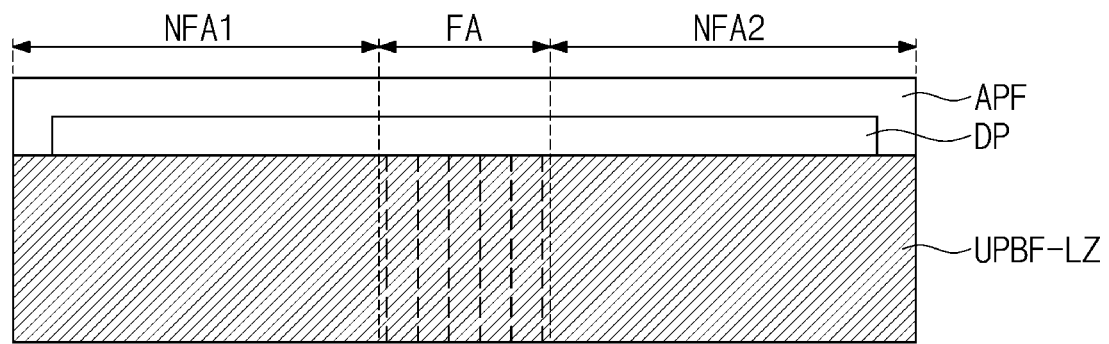
Figure 11C:
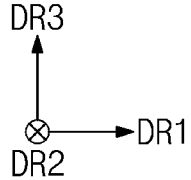

Referring to FIGS. 11B and 11C, the display panel DP shown in FIG. 11A is illustrated. The first preliminary lower plate UPBF may be irradiated with the laser LZ to form the second preliminary lower plate UPBF-LZ. Thereafter, an acid resistant layer APF covering the display panel DP may be formed. The acid resistant layer APF may include a material having acid resistance as shown in FIG. 11C. The acid resistant layer APF may be formed by attaching an acid-resistant film or may be provided by being coated with an acid-resistant material. The order of the process of radiating the laser LZ and the process of forming the acid resistant layer APF may not be limited to those illustrated in FIGS. 11B and 11C. For example, after the acid resistant layer APF may instead be formed prior to the first preliminary lower plate UPBF being irradiated with the laser LZ.

Figure 11D:
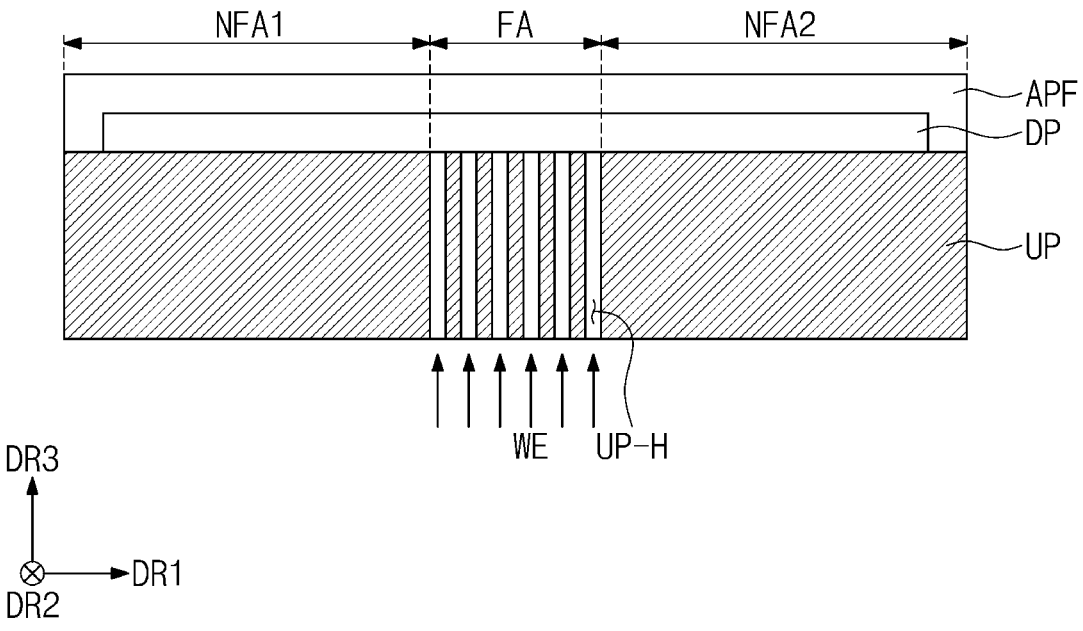
Figure 11E:
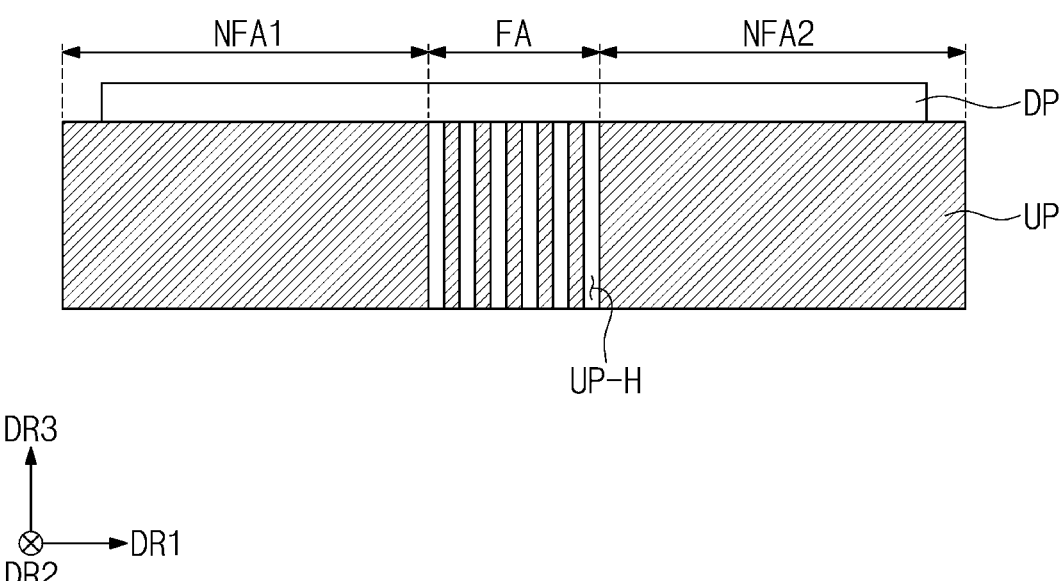

Referring to FIGS. 11C and 11D, the etchant WE may be provided to the second preliminary lower plate UPBF-LZ. Thereafter, a portion of the second preliminary lower plate UPBF-LZ may be removed to form the lower plate UP having the patterns UP-H. Referring to FIGS. 11D and 11E, the patterns UP-H may be formed in a state in which the acid resistant layer APF has been previously attached, and the acid resistant layer APF may then be removed.

Figure 12A:
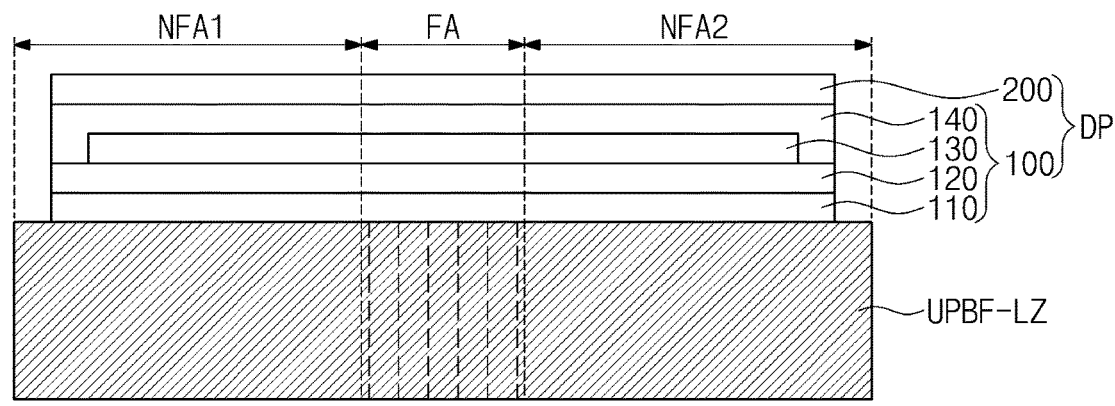
FIGS. 12A and 12B are schematic cross-sectional views illustrating a part of a method of manufacturing a display device according to an embodiment.
Figure 12A:
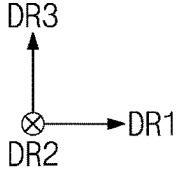
Figure 12B:
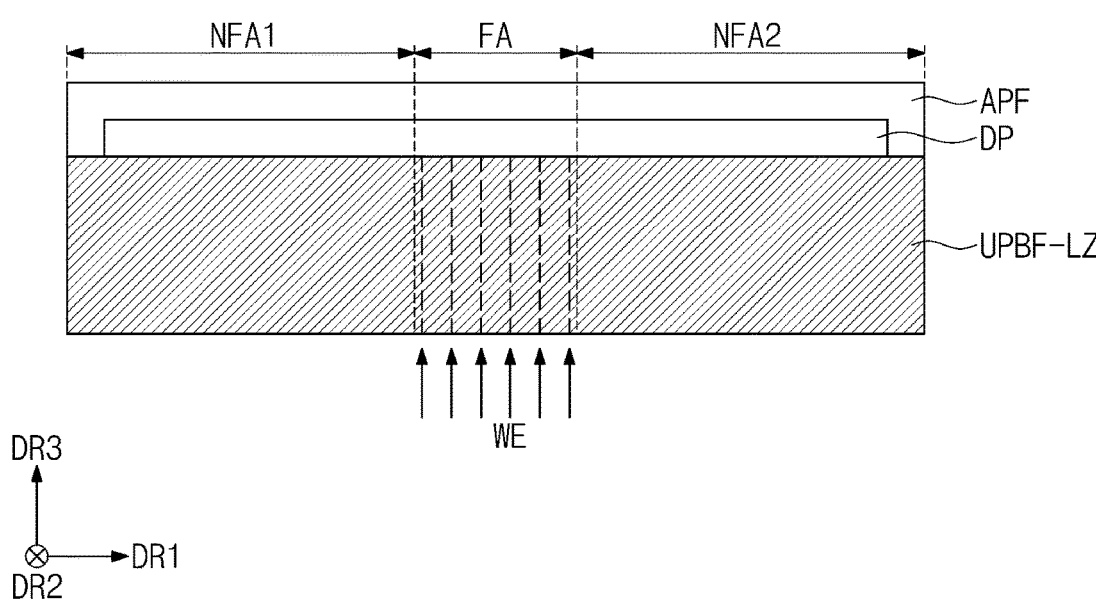

FIGS. 12A and 12B are schematic cross-sectional views illustrating a part of a method of manufacturing a display device according to an embodiment. Referring to FIG. 12A, the display panel DP may be formed on the second preliminary lower plate UPBF-LZ irradiated with the laser. Compared to the case of irradiating the preliminary lower plate with the laser while the display panel DP is coupled, according to the embodiment illustrated in FIG. 12A, damage caused by the laser may not occur on the display panel DP. Referring to FIGS. 12A and 12B, the acid resistant layer APF covering the display panel DP may be formed. Thereafter, the etchant WE may be applied to the second preliminary lower plate UPBF-LZ irradiated with the laser LZ. As a result and as shown in FIG. 11E, the lower plate UP having the patterns UP-H may be formed.

According to an embodiment of the disclosure, the preliminary lower plate UPBF-LZ irradiated with the laser and the display panel DP may be coupled by an adhesive layer DU-AL (see FIG. 4). Thereafter, the acid resistant layer APF covering the display panel DP and the adhesive layer DU-AL may be formed, and the etchant WE may be provided to form the patterns UP-H (see FIG. 4).

Figure 13:
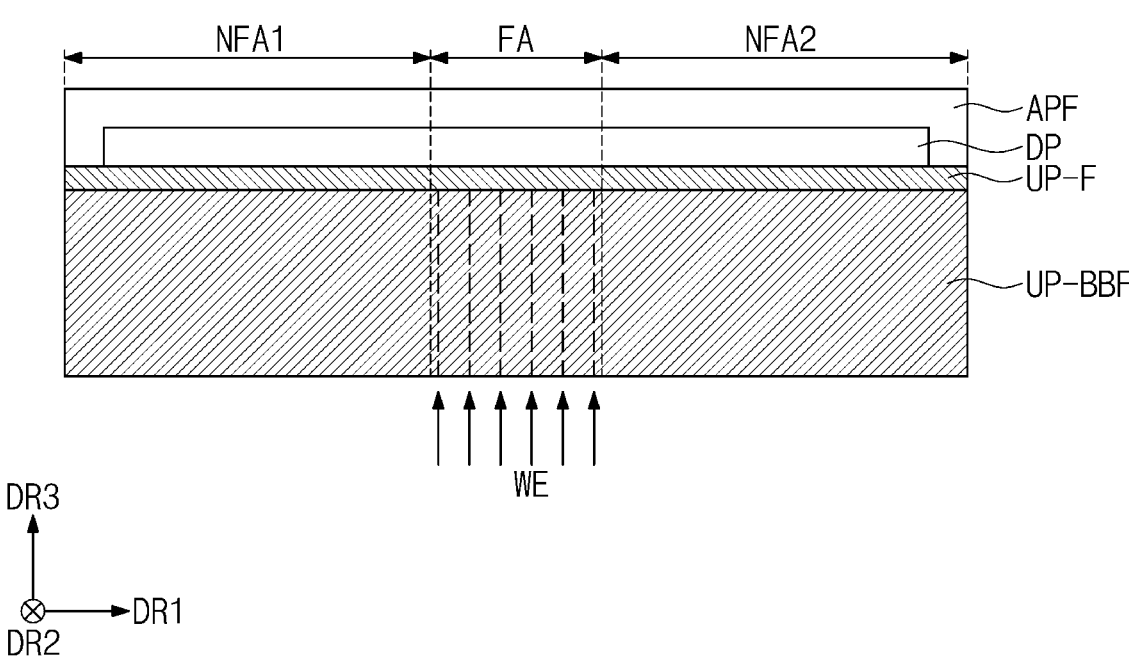
FIG. 13 is a schematic cross-sectional view showing a part of a method of manufacturing a display device according to an embodiment of the disclosure.

FIG. 13 is a schematic cross-sectional view showing a part of a method of manufacturing a display device according to an embodiment of the disclosure. Referring to FIGS. 6A and 13, a preliminary base substrate UP-BBF may be provided. Then, the functional layer UP-F may be formed on the preliminary base substrate UP-BBF. Thereafter, the display panel DP may be formed (e.g., directly formed) on the functional layer UP-F.

In an embodiment of the disclosure, in case that the functional layer UP-F includes a laser light shielding layer, after the functional layer UP-F is formed, the preliminary base substrate UP-BBF may be irradiated with a laser. In an embodiment of the disclosure, in case that the functional layer UP-F also includes an etch-stop layer, the etchant WE may be provided after the functional layer UP-F is formed. Accordingly, the patterns UP-H may be formed after the functional layer UP-F is formed.

Figure 14A:
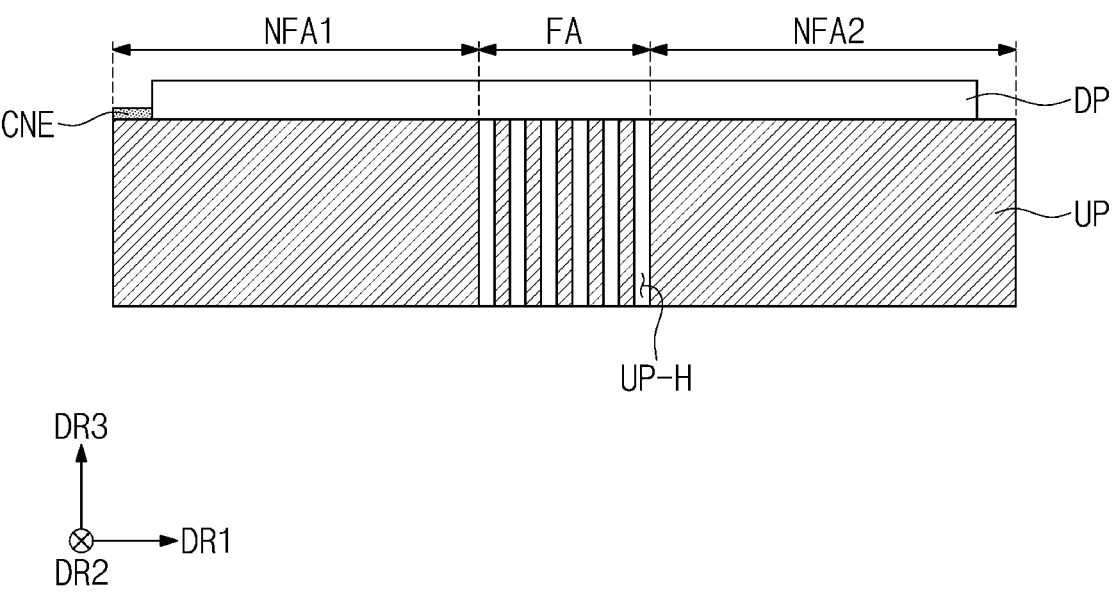
FIGS. 14A and 14B are schematic cross-sectional views illustrating a part of a method of manufacturing a display device according to an embodiment of the disclosure.
Figure 14B:
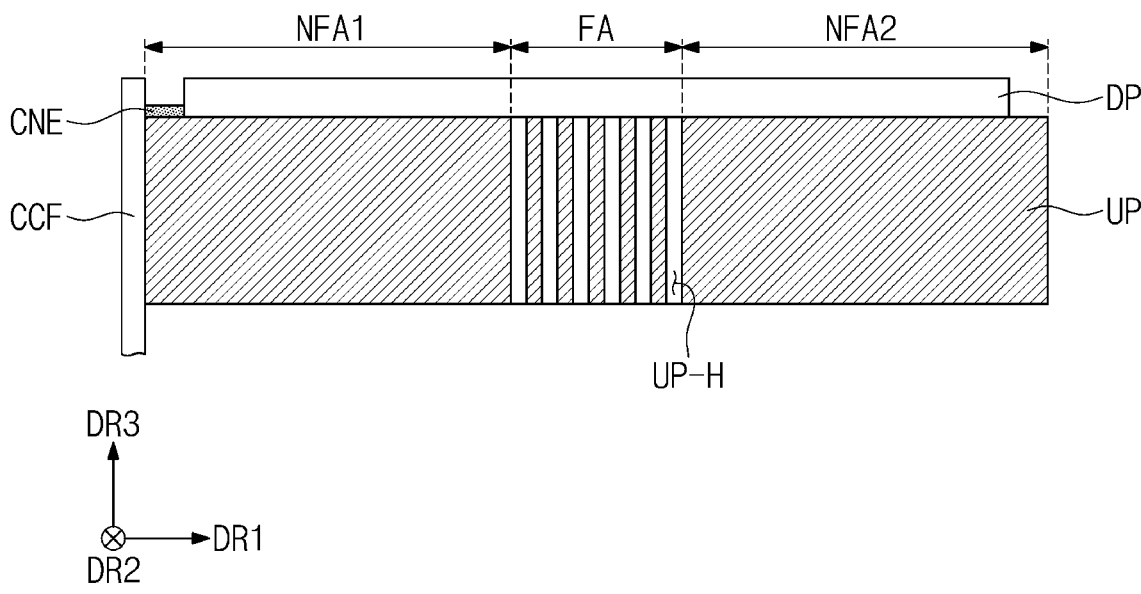

FIGS. 14A and 14B are schematic cross-sectional views illustrating a part of a method of manufacturing a display device according to an embodiment of the disclosure. Referring to FIG. 14A, an electrode CNE may be formed on the upper surface of the lower plate UP. The electrode CNE may be electrically connected to the circuit layer 120 (see FIG. 12A) of the display panel DP. Referring to FIG. 14B, a circuit film CCF may be coupled to side surfaces of the electrode CNE and the lower plate UP. For example, a driving chip for driving pixels of the display panel DP may be mounted on the circuit film CCF. According to an embodiment of the disclosure, a side bonding structure may be implemented, in which the circuit film CCF may be coupled to the side surface of the lower plate UP and the side surface of the electrode CNE disposed on the lower plate UP. Accordingly, the area of the non-display area NDA (see FIG. 1A) of the electronic device EDE (see FIG. 1A) may be reduced.

Figure 15A:
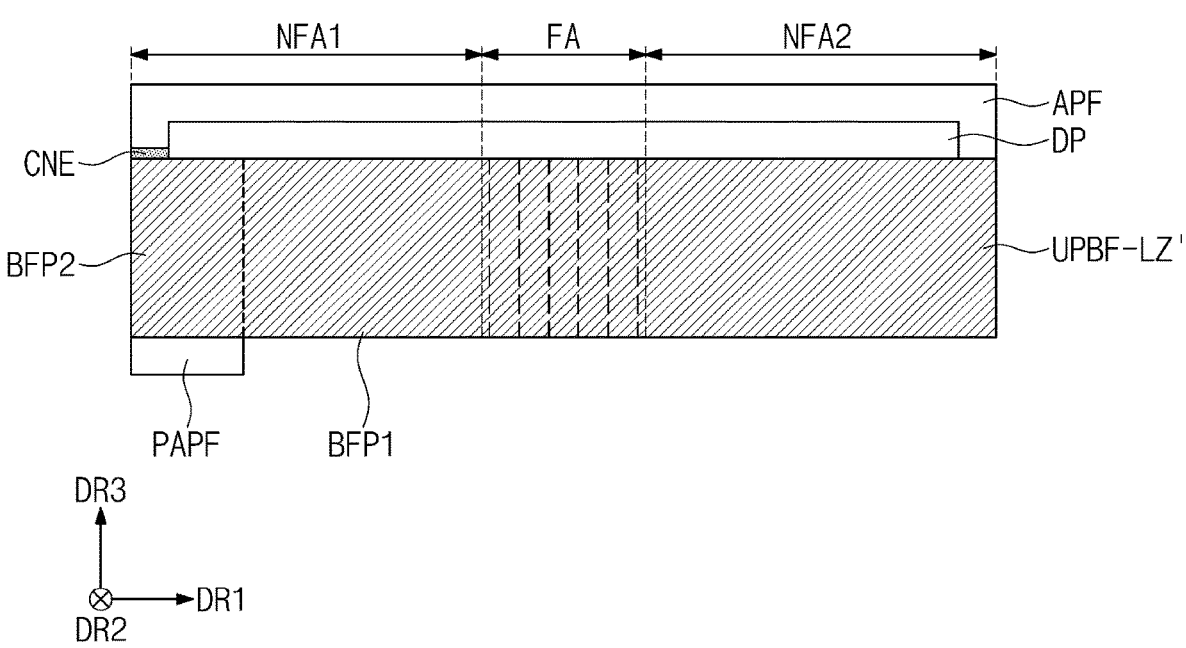
FIGS. 15A to 15C are schematic cross-sectional views illustrating a part of a method of manufacturing a display device according to an embodiment of the disclosure.
Figure 15B:
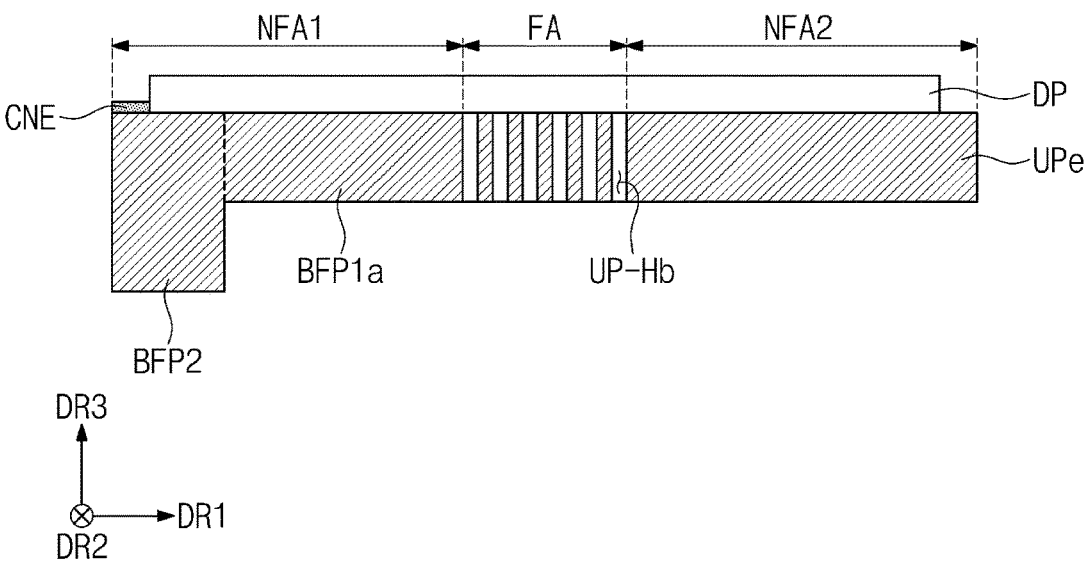
Figure 15C:
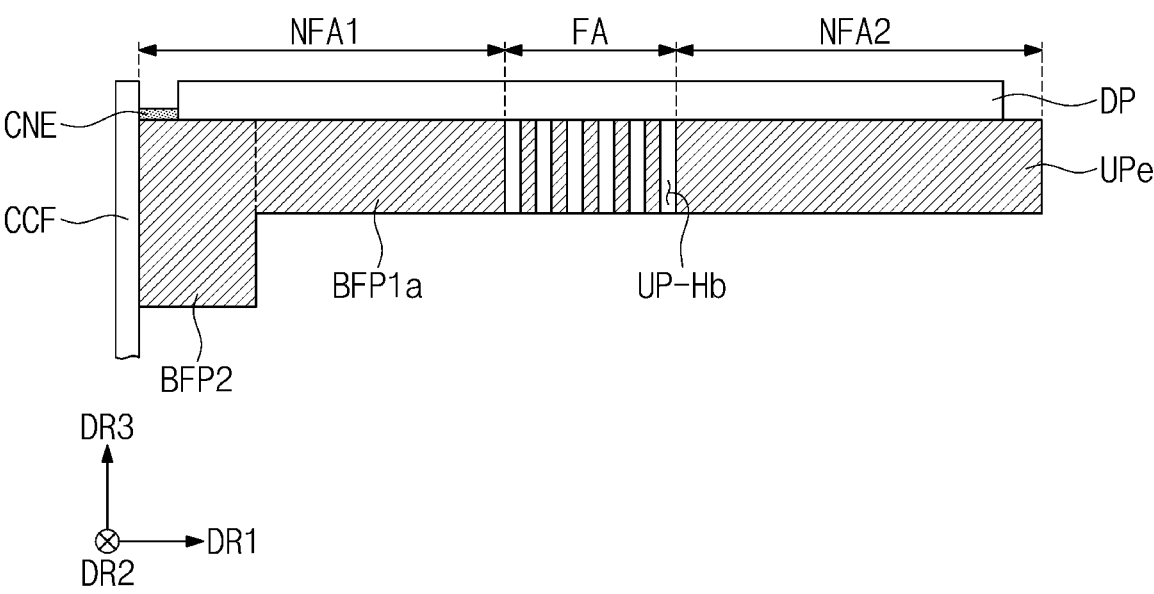

FIGS. 15A to 15C are schematic cross-sectional views illustrating a part of a method of manufacturing a display device according to an embodiment of the disclosure. Referring to FIG. 15A, a preliminary base substrate UPBF-LZ' may include a first portion BFP1 and a second portion BFP2. The preliminary base substrate UPBF-LZ' of FIG. 15A may be the same as or be different from second preliminary base substrate UPBF-LZ of FIGS. 10A, 11B, 11C, 12A and 12B. The first portion BFP1 may overlap the display panel DP, and the second portion BFP2 may extend from the first portion BFP1. An etch-stop PAPF may be formed on a lower surface of the second portion BFP2 in the preliminary base substrate UPBF-LZ'. The electrode CNE may be formed on the upper surface of the lower plate UP. The electrode CNE may be electrically connected to the display panel DP. For example, the electrode CNE may be formed during a process of forming the circuit layer 120 (see FIG. 12A) of the display panel DP. The electrode CNE may be disposed on an upper surface of the second portion BFP2.

Referring to FIGS. 15A and 15B, a portion of the first portion BFP1 of the preliminary base substrate UPBF-LZ' may be removed. For example, a portion of the first portion BFP1 in the thickness direction (i.e., the third direction DR3) may be removed to form a first portion BFP1*a* resulting in a reduced thickness. A portion of the first portion BFP1 of the preliminary base substrate UPBF-LZ' in the thickness direction may be simultaneously removed during a process of forming multiple patterns UP-Hb, but may not be particularly limited thereto. For example, in alternative embodiments, after a portion of the first portion BFP1 of the preliminary base substrate UPBF-LZ' in the thickness direction may be removed, the patterns UP-Hb may be formed, or after the patterns UP-Hb are formed, a portion of the first portion BFP1 of the preliminary base substrate UPBF-LZ' in the thickness direction may be removed.

At least a portion of the second portion BFP2 may not overlap the display panel DP. The circuit film CCF may be coupled to the side surfaces of the electrode CNE and the second portion BFP2 of a lower plate UPe as shown in FIG. 15C so that circuit film CCF may be in electrical contact with the electrode CNE. As a result, the thickness of the second portion BFP2 may be greater than that of the first portion BFP1*a*. Thus, the circuit film CCF may be coupled more stably. The first portion BFP1*a* may be referred to as a support portion, and the second portion BFP2 may be referred to as a protrusion portion.

Figure 16:
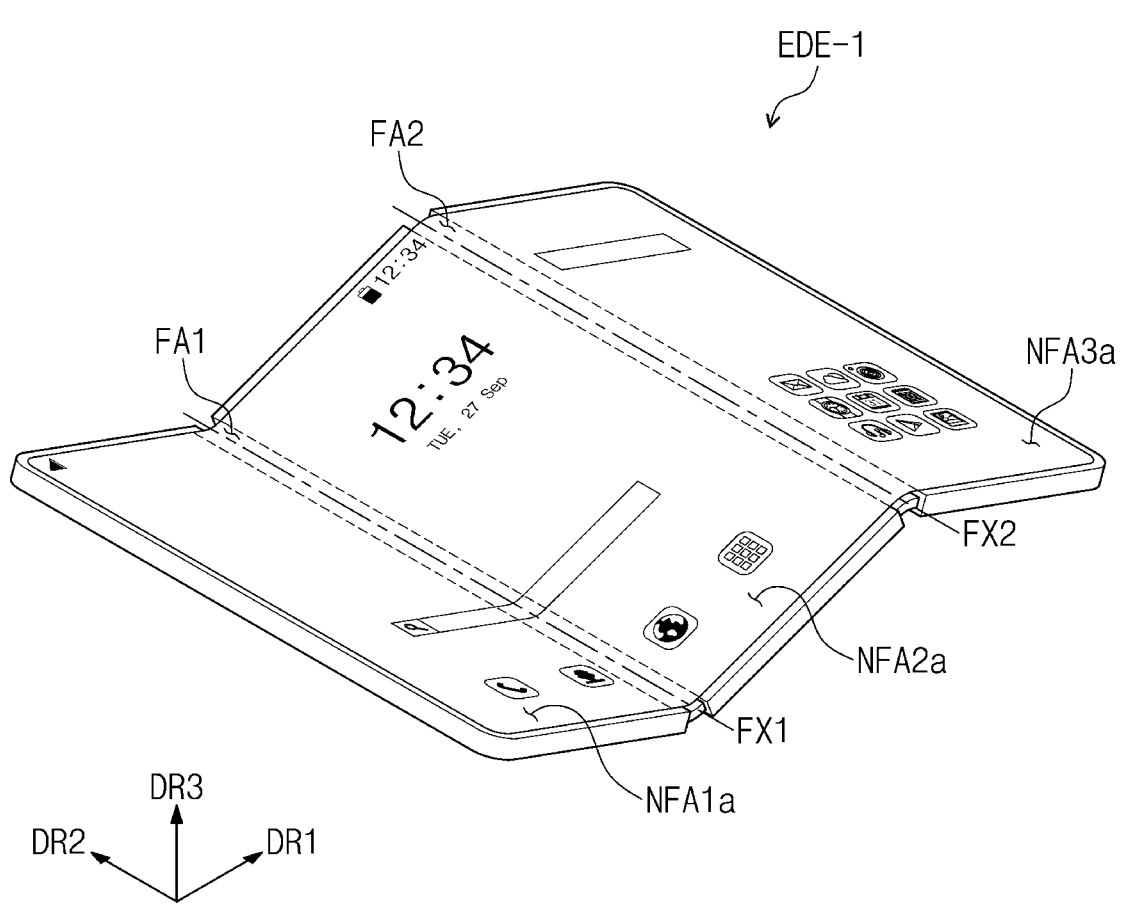
FIG. 16 is a perspective view of an electronic device according to an embodiment of the disclosure.

FIG. 16 is a perspective view of an electronic device EDE-1 according to an embodiment of the disclosure. Referring to FIG. 16, the electronic device EDE-1 may include folding areas FA1 and FA2 and multiple non-folding areas NFA1*a*, NFA2*a* and NFA3*a*. The folding areas FA1 and FA2 may include the first folding area FA1 and the second folding area FA2. The non-folding areas NFA1*a*, NFA2*a*, and NFA3*a* may include the first non-folding area NFA1*a*, the second non-folding area NFA2*a*, and the third non-folding area NFA3*a*.

The first folding area FA1 may be folded based on a first folding axis FX1. Accordingly, the first non-folding area NFA1*a* and the second non-folding area NFA2*a* may face each other. Accordingly, in case that the electronic device EDE-1 may be completely folded, the first non-folding area NFA1*a* and the second non-folding area NFA2*a* may face each other, which may be referred to as in-folding. The second folding area FA2 may be folded based on a second folding axis FX2. Accordingly, the second non-folding area NFA2*a* and the third non-folding area NFA3*a* may oppose each other.

In a fully folded state of the electronic device EDE-1, the third non-folding area NFA3*a* may be exposed to an outside, which may be referred to as out-folding. As the first folding area FA1 may be in-folded and the second folding area FA2 may be out-folded, the radius of curvature of the first folding area FA1 may be smaller than that of the second folding area FA2. The radii of curvature may be defined based on the same plane.

The lower plates described above with reference to FIGS. 4, 5, 6A, 7, 8, 9, 14B, and 15B may also be applied to the electronic device EDE-1 shown in FIG. 15. For example, the patterns formed on the lower plates may overlap the first folding area FA1 and the second folding area FA2.

Figure 17:
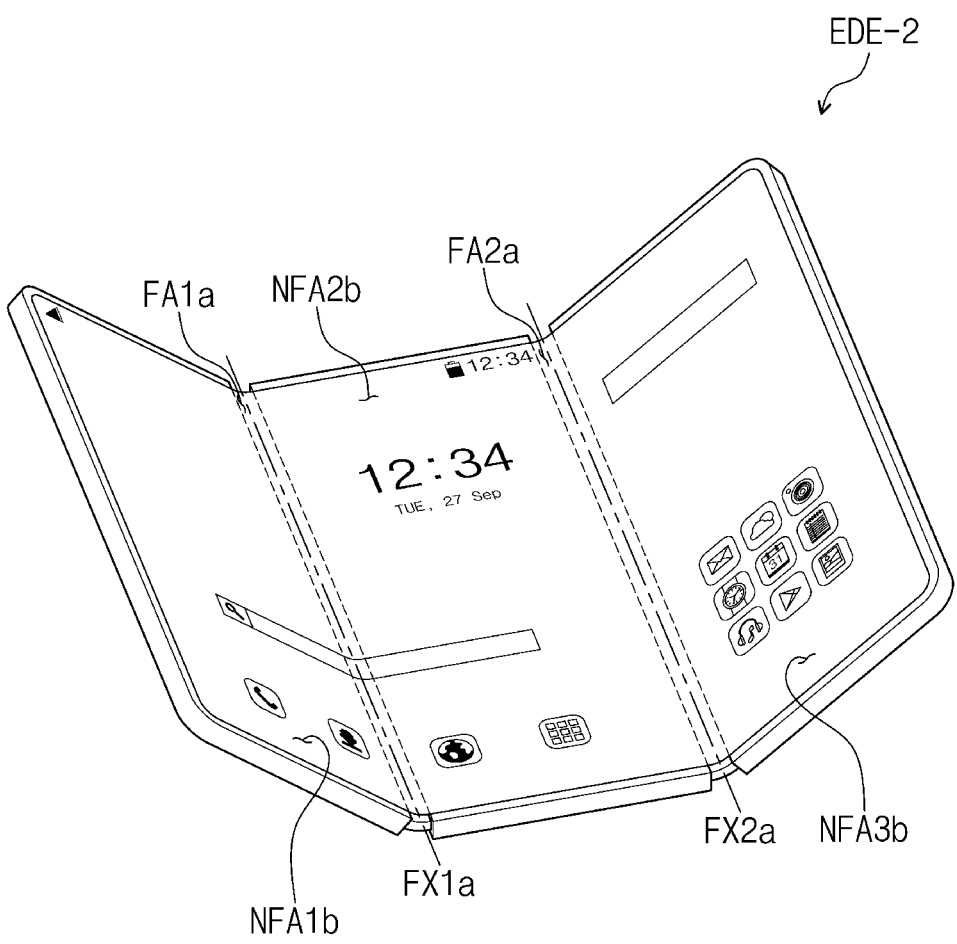
FIG. 17 is a perspective view of an electronic device according to an embodiment of the disclosure.
Figure 17:
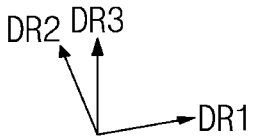

FIG. 17 is a perspective view of an electronic device EDE-2 according to an embodiment of the disclosure. Referring to FIG. 17, the electronic device EDE-2 may include folding areas FA1*a* and FA2*a* and multiple non-folding areas NFA1*b*, NFA2*b* and NFA3*b*. The folding areas FA1*a* and FA2*a* may include the first folding area FA1*a* and the second folding area FA2*a*. The non-folding areas NFA1*b*, NFA2*b* and NFA3*b* may include the first non-folding area NFA1*b*, the second non-folding area NFA2*b*, and the third non-folding area NFA3*b*.

The first folding area FA1*a* may be folded based on a first folding axis FX1*a*. The second folding area FA2*a* may be folded based on a second folding axis FX2*a*. For example, both the first folding area FA1*a* and the second folding area FA2*a* may be in-folded. Accordingly, in a fully folded state of the electronic device EDE-2, the first non-folding area NFA1*b* and the third non-folding area NFA3*b* may overlap the second non-folding area NFA2*b*. In an embodiment of the disclosure, both the first folding area FA1*a* and the second folding area FA2*a* may be out-folded.

The lower plates described above in FIGS. 4, 5, 6A, 7, 8, 9, 14B, and 15B may also be applied to the electronic device EDE-2 shown in FIG. 17. For example, the patterns formed on the lower plates may overlap the first folding area FA1*a* and the second folding area FA2*a*.

As described above, in case that the lower plate may be disposed under (e.g., directly under) the display panel, even though an impact occurs on the upper portion of the display panel, a change in stress in the lower portion of the display panel may not be large. Accordingly, defects occurring in the display panel due to impact from the top may be reduced. Because the lower plate may be disposed under (e.g., directly under) the display panel, a protective film or cover film having a lower modulus of elasticity than the lower plate may be omitted between the display panel and the lower plate. The lower plate may include glass. In the case of glass, the surface quality may be relatively improved over that of carbon fiber reinforced plastic. Accordingly, the surface quality of the display device may be improved by disposing the lower plate including glass under the display panel.

The lower plate may include the functional layer contacting (e.g., directly contacting) the display panel. The functional layer may serve as an etch-stop in case of forming the patterns on the base substrate of the lower plate. Accordingly, in case that the functional layer may be provided, shape accuracy of the patterns may be improved and the functional layer may serve to improve adhesion between display panel and the lower plate.

While the disclosure has been described with reference to embodiments thereof, it will be apparent to those of ordinary skill in the art that various changes and modifications may be made thereto without departing from the spirit and scope of the disclosure as set forth in the following claims. Therefore, the technical scope of the disclosure is not limited to the contents described in the detailed description of the specification, but should be defined by the claims.

What is claimed is:

1. A display device comprising:

a display panel in which a first non-folding area, a folding area, and a second non-folding area are sequentially defined in a first direction; and a lower plate which is coupled to a lower portion of the display panel and in which a plurality of patterns overlapping the folding area are etched therein, wherein a minimum width of the display panel in the first direction is smaller than a minimum width of the lower plate in the first direction.

2. The display device of claim 1, wherein an upper surface of the lower plate directly contacts a lower surface of the display panel.

3. The display device of claim 1, wherein the lower plate includes:

a base substrate on which the plurality of patterns are defined; and a functional layer disposed on an upper surface of the base substrate, wherein the functional layer includes at least one of an etch-stop layer and a laser light shielding layer.

4. The display device of claim 1, wherein the lower plate includes glass.

5. The display device of claim 1, wherein at least some of the plurality of patterns penetrate from a lower surface of the lower plate toward an upper surface of the lower plate.

6. The display device of claim 1, wherein at least some of the plurality of patterns have a concave shape in a direction from a lower surface of the lower plate toward an upper surface of the lower plate.

7. The display device of claim 1, further comprising:

an adhesive layer disposed between the lower plate and the display panel, wherein the lower plate is coupled to the lower portion of the display panel by the adhesive layer.

8. The display device of claim 1, wherein the lower plate includes:

a base substrate in which the plurality of patterns are defined;

a first conductive layer disposed on an upper surface of the base substrate and including a plurality of first conductive patterns;

a first insulating layer disposed on the upper surface of the base substrate and covering the plurality of first conductive patterns;

a second conductive layer disposed on a lower surface of the base substrate and including a plurality of second conductive patterns; and a second insulating layer disposed on the lower surface of the base substrate and covering the plurality of second conductive patterns.

9. The display device of claim 1, wherein the lower plate includes:

a support portion overlapping the display panel; and a protrusion portion at least partially not overlapping the display panel, and a thickness of the protrusion portion is greater than or equal to a thickness of the support portion.

10. The display device of claim 9, further comprising:

an electrode disposed on an upper surface of the protrusion portion and electrically connected to the display panel; and a circuit film coupled to the electrode and a side surface of the protrusion portion and electrically connected to the electrode.

11. An electronic device comprising:

a display panel in which a first non-folding area, a folding area, and a second non-folding area are sequentially defined in a first direction; and a lower plate coupled to a lower portion of the display panel and including a base substrate in which a plurality of patterns overlapping the folding area are etched therein and a functional layer disposed on an upper surface of the base substrate, wherein the functional layer directly contacts the display panel.

12. The electronic device of claim 11, wherein the functional layer includes amorphous silicon.

13. A method of manufacturing a display device, the method comprising:

forming a lower plate; and forming a display panel, wherein the display panel is formed directly on the lower plate, the forming of the lower plate includes forming a plurality of patterns by removing a portion of the lower plate, and a minimum width of the display panel in a first direction is smaller than a minimum width of the lower plate in the first direction.

14. The method of claim 13, wherein the forming of the display panel includes:

forming a base layer directly on an upper surface of the lower plate by coating a base material onto the upper surface;

forming a circuit layer on the base layer;

forming an element layer on the circuit layer; and forming an encapsulation layer on the element layer.

15. The method of claim 14, further comprising:

forming an electrode electrically connected to the circuit layer of the display panel on the upper surface of the lower plate; and coupling a circuit film to the electrode and a side surface of the lower plate.

16. The method of claim 15, wherein the forming of the lower plate further includes:

preparing a base substrate including a first portion overlapping the display panel and a second portion extending from the first portion;

forming an etch-stop layer on a lower surface of the second portion of the base substrate; and removing a portion of the first portion of the base substrate in a thickness direction, wherein the circuit film is coupled to a side surface of the second portion.

17. The method of claim 13, further comprising:

forming an acid resistant layer covering the display panel after coupling the display panel and the lower plate; and removing the acid resistant layer, wherein the forming of the plurality of patterns is performed in a state where the acid resistant layer is formed.

18. The method of claim 13, wherein the forming of the plurality of patterns includes:

irradiating a laser while the display panel and the lower plate are coupled; and etching the lower plate irradiated by the laser.

19. The method of claim 13, wherein the forming of the lower plate further includes irradiating a laser onto the lower plate, the display panel is formed on the lower plate after the irradiating of the laser onto the lower plate, and the plurality of patterns are formed after the display panel is formed on the lower plate.

20. The method of claim 13, wherein the forming of the lower plate further includes:

providing a base substrate; and forming a functional layer on the base substrate, wherein the plurality of patterns are formed after the forming of the functional layer on the base substrate, and the functional layer includes at least one of an etch-stop layer and a laser light shielding layer.

\* \* \* \* \*